US00RE44831E

(19) United States
(12) Reissued Patent
Tanaka et al.

(10) Patent Number: US RE44,831 E
(45) Date of Reissued Patent: Apr. 8, 2014

(54) ORGANIC ELECTROLUMINESCENT DEVICE, DISPLAY, AND ILLUMINATING DEVICE

(75) Inventors: Tatsuo Tanaka, Tokyo (JP); Hideo Taka, Tokyo (JP)

(73) Assignee: Konica Minolta Holdings, Inc. (JP)

(21) Appl. No.: 13/609,296

(22) Filed: Sep. 11, 2012

Related U.S. Patent Documents

Reissue of:
(64) Patent No.: 7,935,434
Issued: May 3, 2011
Appl. No.: 12/159,963
PCT Filed: Dec. 26, 2006
PCT No.: PCT/JP2006/325857
§ 371 (c)(1),
(2), (4) Date: Jul. 2, 2008
PCT Pub. No.: WO2007/077810
PCT Pub. Date: Jul. 12, 2007

(30) Foreign Application Priority Data

Jan. 5, 2006 (JP) ..... 2006-000473

(51) Int. Cl.
*H01L 51/54* (2006.01)

(52) U.S. Cl.
USPC ..... 428/690; 428/917; 313/504; 313/505; 313/506; 546/18; 546/79; 546/81; 546/101

(58) Field of Classification Search
USPC ..... 428/690, 917; 313/504, 505, 506; 546/18, 79, 81, 101; 257/40, E51.05, 257/E51.026, E51.032
See application file for complete search history.

(56) References Cited

U.S. PATENT DOCUMENTS

| | | | |
|---|---|---|---|
| 2004/0002576 | A1 | 1/2004 | Oguma et al. |
| 2007/0103059 | A1 | 5/2007 | Tsubata et al. |

FOREIGN PATENT DOCUMENTS

| | | | |
|---|---|---|---|
| JP | 6-1972 | A | 1/1994 |
| JP | 7-331238 | A | 12/1995 |
| JP | 8-3547 | A | 1/1996 |
| JP | 9-249876 | A | 9/1997 |
| JP | 2001-257076 | A | 9/2001 |
| JP | 1344788 | A1 | 3/2003 |
| JP | 2003-133075 | A | 5/2003 |
| JP | 1344788 | A1 | 9/2003 |
| JP | 2006-128800 | A1 | 12/2006 |
| JP | 2006-352046 | A | 12/2006 |
| JP | 2008-545729 | A | 12/2008 |
| WO | 2004-072205 | A2 * | 8/2004 |
| WO | WO 2004/072205 | * | 8/2004 |
| WO | 2004101682 | A | 11/2004 |
| WO | 2006128800 | A1 | 12/2006 |

OTHER PUBLICATIONS

Nemoto et. al., Synthesis of Novel pi-Conjugating Polymers Based on Dibenzothiophene, 2003, Journal of Polymer Science: Part A; Polymer Chemistry, vol. 41, pp. 1521-1526.*
International Search Report for International Application No. PCT/JP2006/325857 mailed Mar. 27, 2007.
Notification of Reasons for Refusal for Japanese Application No. 2012-120526, drafted Sep. 11, 2013, with English translation.
Database WPI Week 199610, Thomson Scientific, London, GB; AN, 1996-094484, XP002584363.
Extended European Search Report for Application No./Patent No. 06843241.8-2111/1970976 dated Jun. 14, 2010.

* cited by examiner

*Primary Examiner* — Gregory Clark
(74) *Attorney, Agent, or Firm* — Cantor Colburn LLP

(57) ABSTRACT

An organic electroluminescent element including at least an emission layer sandwiched between an anode and a cathode, wherein the emission layer comprises at least a compound represented by Formula (A), Formula (A)

13 Claims, 1 Drawing Sheet

ORGANIC ELECTROLUMINESCENT DEVICE, DISPLAY, AND ILLUMINATING DEVICE

Matter enclosed in heavy brackets [ ] appears in the original patent but forms no part of this reissue specification; matter printed in italics indicates the additions made by reissue.

CROSS REFERENCE TO RELATED APPLICATIONS

This is a U.S. national stage of application No. PCT/JP2006/325857, filed on 26 Dec. 2006. Priority under 35 U.S.C. §119(a) and 35 U.S.C. §365(b) is claimed from Japanese Application No. 2006-000473, filed 5 Jan. 2006, the disclosure of which is also incorporated herein by reference.

TECHNICAL FIELD

The present invention relates to an organic electroluminescent element, a display device and a lighting device.

BACKGROUND

Conventionally, an emission type electronic display device includes an electroluminescence display (hereinafter, referred to as an ELD). A constituent element of ELD includes such as an inorganic electroluminescent element and an organic electroluminescent element (hereinafter, referred to as an organic EL element). An inorganic electroluminescent element has been utilized as a flat light source, however, requires a high voltage of alternating current to operate an emission element.

An organic electroluminescent element is an element provided with a constitution comprising an emission layer containing a emitting substance being sandwiched with a cathode and an anode, and an exciton is generated by an electron and a positive hole being injected into the emission layer to be recombined, resulting emission utilizing light release (fluorescence-phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

However, in an organic electroluminescence in view of the future practical application, desired has been development of an organic EL element which efficiently emits at a high luminance with a low electric consumption.

In Japanese Patent No. 3093796, a slight amount of a fluorescent substance has been doped in a stilbene derivative, distyrylarylene derivative or a tristyrylarylene derivative, to achieve improved emission luminance and a prolonged lifetime of an element.

Further, there are known such as an element having an organic emission layer comprising a 8-hydroxyquinoline aluminum complex as a host compound which is doped with a slight amount of a fluorescent substance (for example, JP-A 63-264692 (hereinafter, JP-A refers to Japanese Patent Publication Open to Public Inspection No.)) and an element having an organic emission layer comprising a 8-hydroxyquinoline aluminum complex as a host compound which is doped with quinacridone type dye (for example, JP-A 3-255190).

In the case of utilizing emission from an excited singlet as described above, since a generation ratio of a singlet exciton to a triplet exciton is 1:3, that is, a generation probability of an emitting exciton species is 25% and a light taking out efficiency is approximately 20%, the limit of a quantum efficiency (ηext) of taking out is said to be 5%.

However, since an organic EL element which utilizes phosphorescence from an excited triplet has been reported from Princeton University (M. A. Baldo et al., Nature vol. 395, pp. 151-154 (1998)), researches on materials exhibiting phosphorescence at room temperature have come to be active.

For example, it is also disclosed in A. Baldo et al., Nature, vol. 403, No. 17, pp. 750-753 (2000), and U.S. Pat. No. 6,097,147.

Since the upper limit of internal quantum efficiency becomes 100% by utilization of an excited triplet, which is principally 4 times of the case of an excited singlet, it may be possible to achieve almost the same ability as a cooled cathode ray tube to attract attention also for an illumination application.

For example, in such as S. Lamansky et al., J. Am. Chem. Soc., vol. 123, p. 4304 (2001), many compounds mainly belonging to heavy metal complexes such as iridium complexes have been synthesized and studied.

Further, in aforesaid, A. Baldo et al., Nature, vol. 403, No. 17, pp. 750-753 (2000), utilization of tris(2-phenylpyridine) iridium as a dopant has been studied.

In addition to these, M. E. Tompson et al., at The 10th International Workshops on Inorganic and Organic Electroluminescence (EL'00, Hamamatsu), have studied to utilize $L_2Ir$(acac) such as $(ppy)_2Ir$(acac) as a dopant, Moon-Jae Youn. Og., Tetsuo Tsutsui et al., also at The 10th International Workshops on Inorganic and Organic Electroluminescence (EL'00, Hamamatsu), have studied utilization of such as tris (2-(p-tolyl)pyridine)iridium ($Ir(ptpy)_3$) and tris(benzo[h] quinoline)iridium ($Ir(bzq)_3$) (herein, these metal complexes are generally referred to as orthometalated iridium complexes.).

Further, in also the aforesaid, S. Lamansky et al., J. Am. Chem. Soc., vol. 123, p. 4304 (2001), studies have been carried out to prepare an element utilizing various types of iridium complexes.

Further, to obtain high emission efficiency, Ikai et al., at The 10th International Workshops on Inorganic and Organic Electroluminescence (EL'00, Hamamatsu) utilized a hole transporting compound as a host of a phosphorescent compound. Further, M. E. Tompson et al. utilized various types of electron transporting materials as a host of a phosphorescent compound doped with a new iridium complex.

Further, at present, organic EL elements employing such iridium complexes are mostly prepared via vapor deposition. Preparation of organic EL elements via coating methods has increasingly been investigated. However, at present, low solubility of iridium complexes makes preparation of such elements via the coating method difficult. Consequently, it is demanded to enhance solubility of the iridium complexes.

An orthometalated complex provided with platinum instead of iridium as a center metal is also attracting attention. With respect to these types of complexes, many examples having a characteristic ligand are known (for example, refer to Patent Documents 1-5).

In any case, emission luminance and emission efficiency are significantly improved compared to conventional elements because the emitting light arises from phosphorescence, however, there has been a problem of a poor emission lifetime of the element compared to conventional elements. It is hard to achieve an emission of a short wavelength and an improvement of an emission lifetime of the element for a phosphorescent emission material provided with a high efficiency. At present state, it cannot be achieved a level of a practical use.

As those which improve the above, known are Ir complexes and Pt complexes which employ phenylimidazole derivatives as a ligand (refer, for example, to Patent Documents 6 and 7). However, the light emission efficiency of these complexes and the lifetime of elements are insufficient, whereby more enhanced efficiency and lifetime of elements are being sought.

Further disclosed as light emitting materials which excel in desired characteristics are polymers having a hetero-condensation polycyclic structure as a repeating unit (refer, for example, to Patent Document 8). However, those materials are limited to polymer compounds, and no description is made with regard to the terminal substituent, whereby it is difficult to estimate excellent characteristics in the case in which a specific substituent is substituted.

[Patent Document 1] JP-A 2002-332291
[Patent Document 2] JP-A 2002-332292
[Patent Document 3] JP-A 2002-338588
[Patent Document 4] JP-A 2002-226495
[Patent Document 5] JP-A 2002-234894
[Patent Document 6] WO 02/15645
[Patent Document 7] WO 05/7767
[Patent Document 8] WO 05/26231

DISCLOSURE OF THE INVENTION

Problems to be Solved by the Invention

An object of this invention is to provide an organic electroluminescent element having high emission efficiency and long emission lifetime, a display device and a lighting device comprising the organic electroluminescent element.

Means to Solve the Problems

An object of the present invention described above has been achieved by the following constitutions.

1. An organic electroluminescent element comprising at least an emission layer sandwiched between an anode and a cathode, wherein the emission layer comprises at least a compound represented by Formula (A), Formula (A)

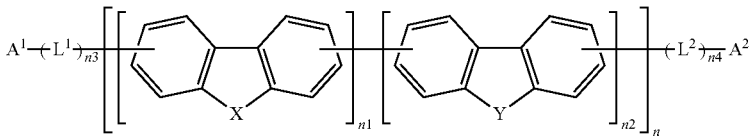

wherein X and Y each represent O, S or N—R(R represents a hydrogen atom or a substituent); $A^1$ and $A^2$ each represent a hydrogen atom or a substituent and at least one of $A^1$ and $A^2$ is a substituent; $L^1$ and $L^2$ each represent a divalent linking group; n is an integer of 1 or more; n1 and n2 each are an integer of 0 or more; n3 and n4 each are 0 or 1; provided that $n1+n2\geq 2$.

2. The organic electroluminescent element of item 1, wherein the compound represented by Formula (A) is further represented by Formula (1), Formula (1)

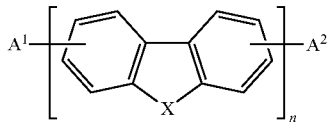

wherein X represents of O, S or N—R(R represents a hydrogen atom or a substituent); n is an integer of 2 or more; $A^1$ and $A^2$ each represent a hydrogen atom or a substituent; and at least one of $A^1$ and $A^2$ each are a substituent.

3. The organic electroluminescent element of item 2, wherein n is an integer of 2 to 10.

4. The organic electroluminescent element of item 2, wherein n is an integer of 2 to 4.

5. The organic electroluminescent element of item 1, wherein the compound represented by Formula (A) is further represented by Formula (2), Formula (2)

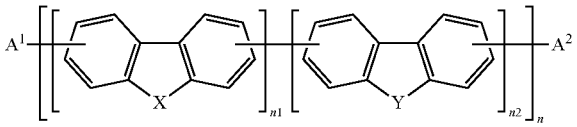

wherein X and Y each represent O, S or N—R(R represents a hydrogen atom or a substituent); n1, n2 and n represent an integer of 1 or more; $A^1$ and $A^2$ each represent a hydrogen atom or a substituent; and at least one of $A^1$ and $A^2$ is a substituent.

6. The organic electroluminescent element of item 5, wherein n is an integer of 1 to 5.

7. The organic electroluminescent element of item 5, wherein n is an integer of 1 or 2.

8. The organic electroluminescent element of item 1, wherein the compound represented by Formula (A) is further represented by Formula (3), Formula (3)

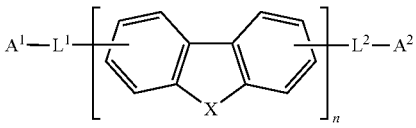

wherein X represents O, S or N—R(R represents a hydrogen atom or a substituent); n is an integer of 2 or more; $L^1$ and $L^2$ each represent a divalent linking group; $A^1$ and $A^2$ each represent a hydrogen atom or a substituent; and at least one of $A^1$ and $A^2$ is a substituent.

9. The organic electroluminescent element of item 8, wherein n is an integer of 2 or more to 10.
10. The organic electroluminescent element of item 8, wherein n is an integer of 2 to 4.
11. The organic electroluminescent element of any one of items 1 to 10, wherein at least one of $A^1$ and $A^2$ incorporate a substituent having a nitrogen atom.
12. The organic electroluminescent element of items 11, wherein the substituent having a nitrogen atom is a carbazolyl group.
13. The organic electroluminescent element of items 11, wherein the substituent having a nitrogen atom is a carbolinyl group.
14. The organic electroluminescent element of items 11, wherein the substituent having a nitrogen atom is a diarylamino group.
15. The organic electroluminescent element of any one of items 1 to 14, wherein X is an oxygen atom.
16. The organic electroluminescent element of any one of items 1 to 15, wherein the emission layer incorporates a phosphorescence-emitting metal complex.
17. The organic electroluminescent element of items 16, wherein the phosphorescence-emitting metal complex is an Ir complex.
18. The organic electroluminescent element of any one of items 1 to 17, generating emission of white color.
19. A display, comprising the organic electroluminescent element described in any one of items 1 to 18.
20. A lighting device comprising the organic electroluminescent element described in any one of items 1 to 18.

Effects of the Invention

According to the present invention, it has become possible to provide an organic electroluminescent element, a display device and a lighting device comprising the organic electroluminescent element which results in high light emission efficiency and exhibits a long light emission life.

DESCRIPTION OF THE ALPHANUMERIC DESIGNATIONS

Figure 1:
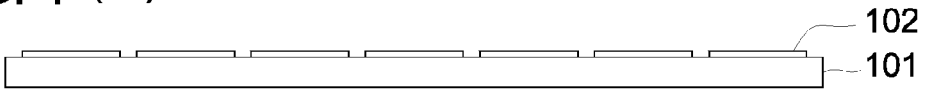
FIG. 1 is a schematic constitutional view of an organic EL full-color display device.
Figure 1:
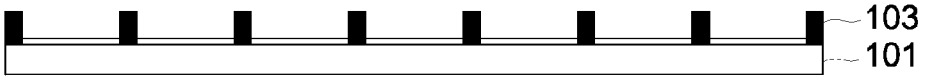
Figure 1:
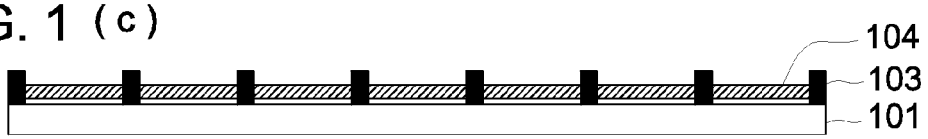
Figure 1:
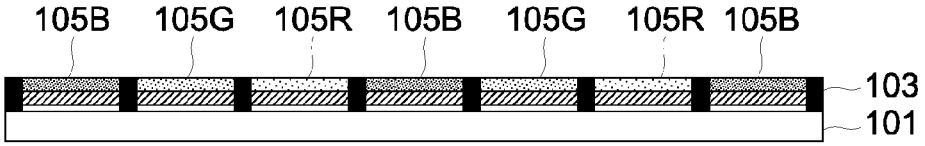
Figure 1:
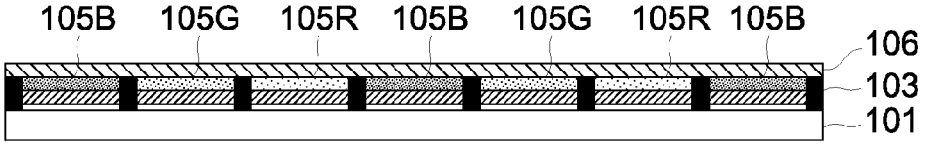

101 glass substrate
102 ITO transparent electrode
103 partition wall
104 positive hole injecting layer
105B, 105G, and 105R light emitting layers

BEST MODES TO CARRY OUT THE INVENTION

The organic EL element of the present invention is characterized in that a light emitting layer, which is sandwiched between an anode and a cathode, incorporates at least one of the compounds represented by above Formula (A), and more specifically, of the compounds represented by Formulas (1)-(3).

In above Formulas (A), and (1)-(3), examples of the substituents represented by $A^1$ and $A^2$ include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); an cycloalkyl group (for example, a cyclopentyl group and a cyclohexyl group); an alkenyl group (for example, a vinyl group and a allyl group); an alkynyl group (for example, an ethynyl group and a propargyl group); an aryl group (for example, a phenyl group, a p-chlorophenyl group, a mesityl group, a tolyl group, a xylyl group, a naphthyl group, an anthoryl group, an azulenyl group, an acenaphthenyl group, a fluorenyl group, a phenanthryl group, an indenyl group, a pyrenyl group, and a biphenyl group); an aromatic heterocyclyl group (for example, a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a quinazolyl group, and a phthalazyl group), a heterocyclyl group (for example, a pyrrolidyl group, an imidazolydyl group, a morpholyl group, and an oxazolydyl group); an alkoxy group (for example, a methoxy group, an ethoxy group, a propyloxy group, a pentyloxy group, a hexyloxy group, an octyloxy group, and a dodecyloxy group); a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group), an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a2-ethylhexylaminocarbonyl group, a dodecylaminocarbonyl group, a phenylaminocarbonyl group, a naphthylaminocarbonyl group, and a 2-puridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsulfinyl group, a butylsulfonyl group, a cyclohexylsulfinyl group, a 2-ethylhexylsulfinyl group, a dodecylsulfinyl group, a phenylsulfonyl group, a naphthylsulfinyl group, and a 2-pyridylsulfinyl group); an alkylsulfonyl group (for example, a methylsulfonyl group and an ethylsulfonyl group, a butylsulfonyl group, a cyclohexylsulfonyl group, a 2-ethylhexylsulfonyl group, and a dodecyl sulfonyl group); an arylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group); a halogen atom (for example, a fluorine atom, a chlorine atom, and a bromine atom); a fluorinated hydrocarbon group (for example, a fluoromethyl group, a trifluoromethyl group, a pentafluoroethyl group, and a pentafluorophenyl group); a cyano group; and a silyl group (for example, a trimethylsilyl group, a triisopropylsilyl group, a triphenylsilyl group, and a phenyldiethylsilyl group). These groups may further have a substituent.

At least one of $A^1$ or $A^2$ is preferably a substituent incorporating a nitrogen atom. Further, preferred as the substituent incorporating a nitrogen atom are a carbazolyl group, a carbolinyl group, and a diarylamino group.

"Aryl of the diarylamino group", as described herein, is as defined for the aryl group described in the substituent represented by each of $A^1$ and $A^2$ in Formula (A).

In Formulas (A) and (1)-(3), X and Y each represents any of O, S, and N—R (wherein R represents a substituent). The substituents represented by above R include a substituted or unsubstituted alkyl group, aryl group, or aromatic heterocyclyl group. Specific examples thereof are those listed in description for $A^1$ and $A^2$.

In Formulas (1) and (3), n is preferably 2-10, but is more preferably 2-4.

In Formula (2), n3 is preferably 1-5, but is more preferably 1 or 2.

The divalent linking groups represented by each of $L^1$ and $L^2$ in Formulas (A) and (3) may include an alkylene group (for example, an ethylene group, a trimethylene group, a tetramethylene group, a propylene group, an ethylethylene group, a pentamethylene group, and a hexamethylene group); an alkenylene group (for example, a vinylene group, a propenylene group, a butenylene group, a pentenylene group, a 1-methylvinylene group, a 1-methylpropenylene group, a 2-methylpropenylene group, a 1-methylpentenylene group, a 3-methylpentenylene group, a 1-ethylvinylene group, a 1-ethylpropenylene group, a 1-ethylbutenylene group, and a 3-ethylbutenylene group); an alkynylene group (for example, an ethynylene group, a propynylene group, a 1-butynylene group, a 1-pentynylene group, a 1-hexynylene group, a 2-butynylene group, a 2-pentynylene group, a 1-methylethynylene group, a 3-methyl-1-propynylene group, and a 3-methyl-1-butynylene group); an arylene group (for example, an o-phenylene group, an m-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group, and a 3,6-biphenyldiyl group); a terphenyldiyl group, a quaterphenyldiyl group, a kinkphenyldiyl group, a sequsiphenyldiyl group, a septiphenyldiyl group, an octiphenyldiyl group, a noviphenyldiyl group, and a deciphenyldiyl group); a heteroarylene group (for example, a carbazole ring, a carboline ring, a diazacarbazole ring (which is also called a monoazacarboline ring, and refers to a ring structure in which one of carbon atoms which constitutes a carboline ring is replaced with a nitrogen atom), a divalent group derived from the group consisting of a triazole ring, a pyrrole ring, a pyrazine ring, a quinoxaline ring, a thiophene ring, an oxadiazole ring, a dibenzofuran ring, a benzothiophene ring, and an indole); a divalent heterocyclyl group (for example, a divalent group derived from a pyrrolidine ring, an imidazoline ring, a morpholine ring, and an oxazolidine ring); and a chalcogen atom such as oxygen or sulfur.

Further, applicable may be groups such as an alkylimino group, a dialkylsilanediyl group, or a diarylgermanediyl group which are linked via a heteroatom.

Further, as above L3, preferred are an arylene group, a heteroarylene group, a divalent heterocyclyl group, and an alkylene group, more preferred is the arylene group, but particularly preferred is the m-phenylene group.

The specific examples represented by Formulas (A) and (1)-(3) are listed below, however the present invention is not limited thereto.

(1)

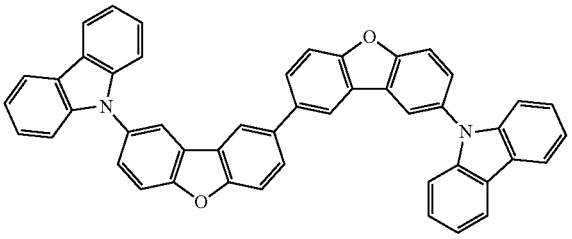

(2)

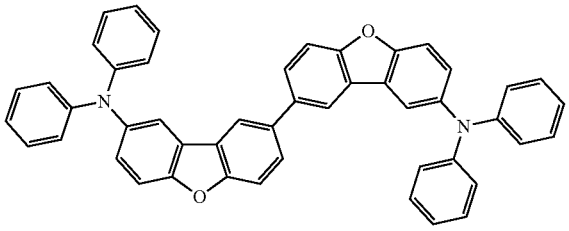

(3)

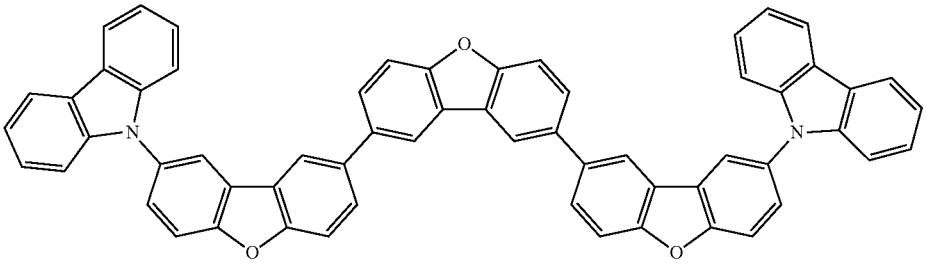

-continued
(4)
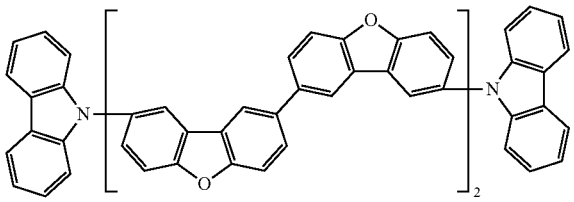
(5)
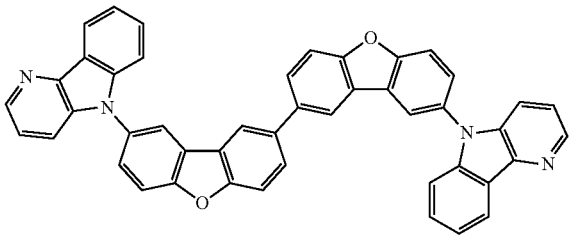
(6)
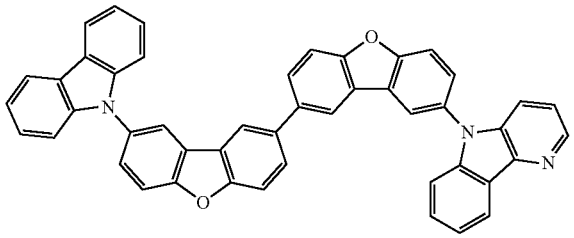
(7)
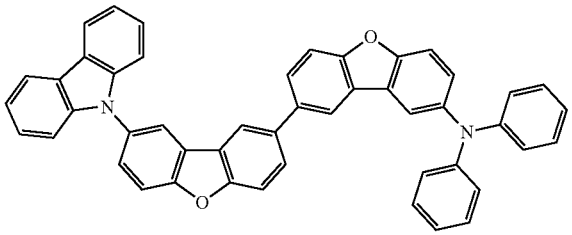
(8)
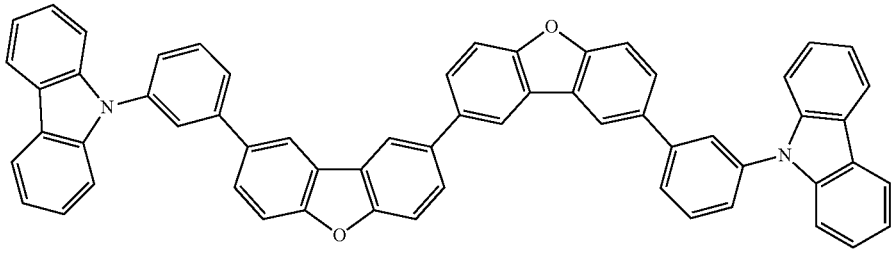
(9)
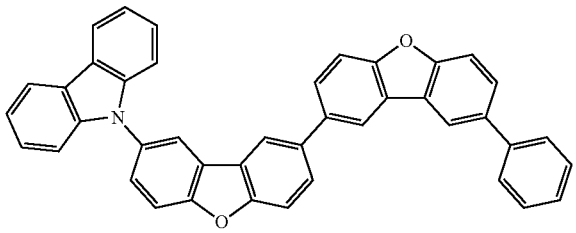
(10)
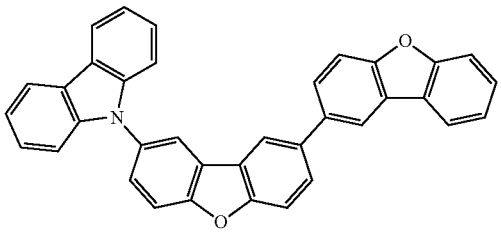
(11)
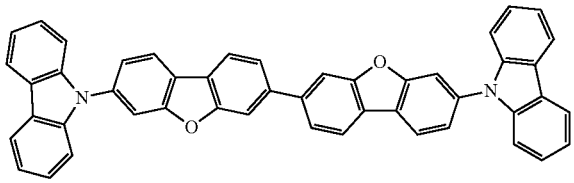
(12)
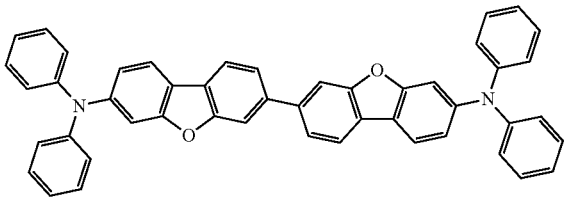
(13)
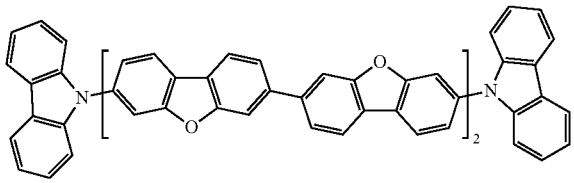
(14)
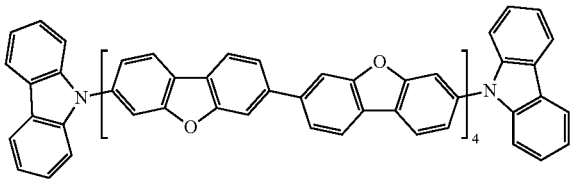

-continued
(15)
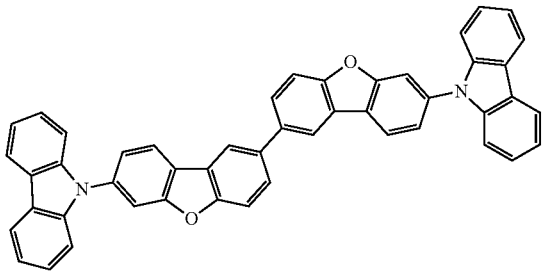
(16)
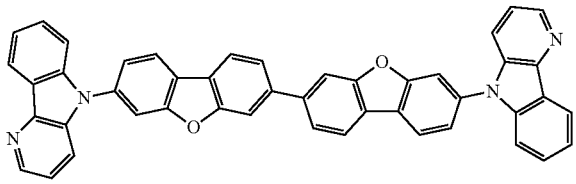
(17)
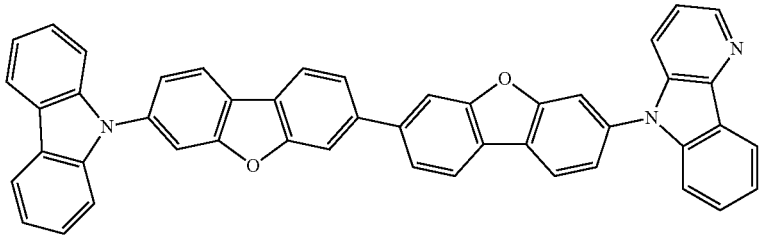
(18)
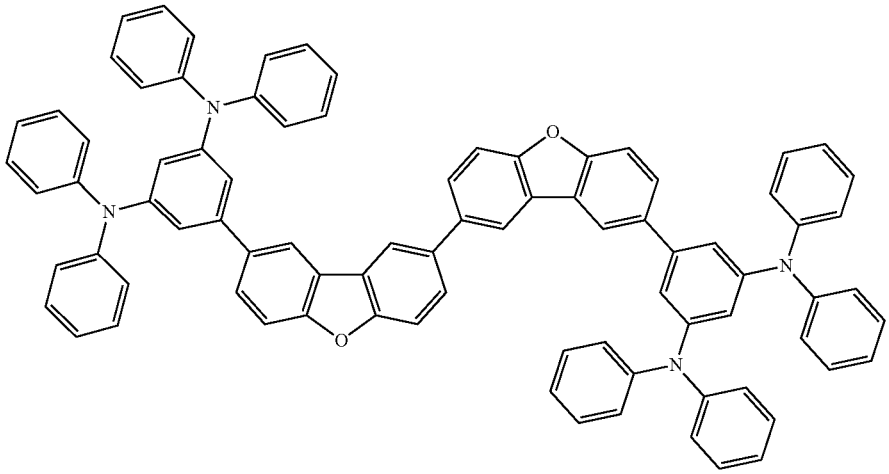
(19)
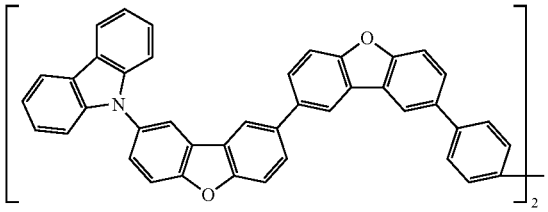
(20)
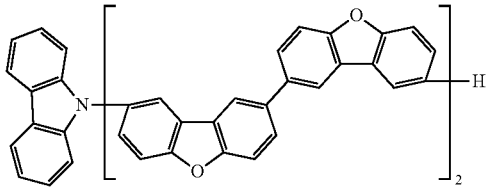
(21)
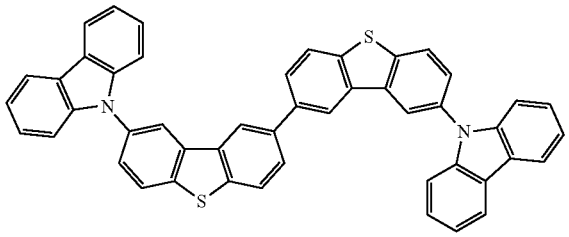
(22)
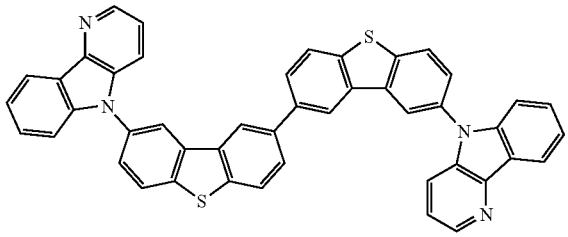

-continued
(23)
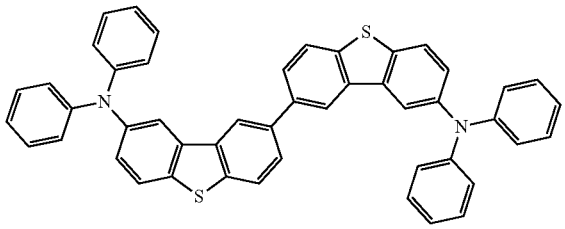
(24)
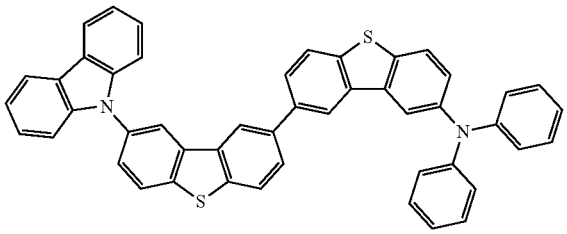
(25)
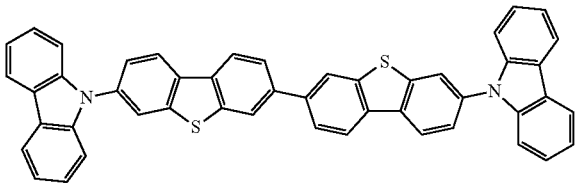
(26)
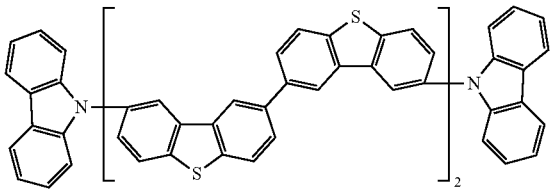
(27)
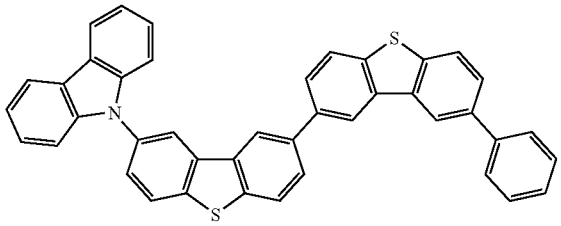
(28)
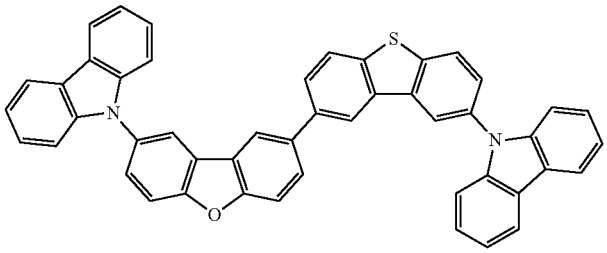
(29)
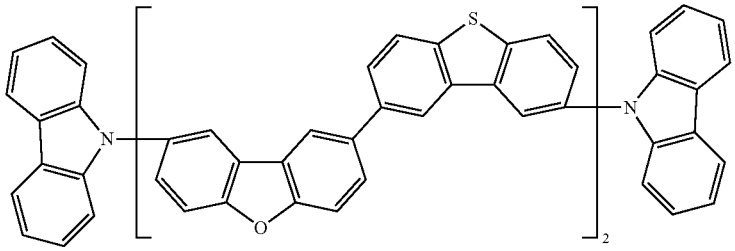
(30)
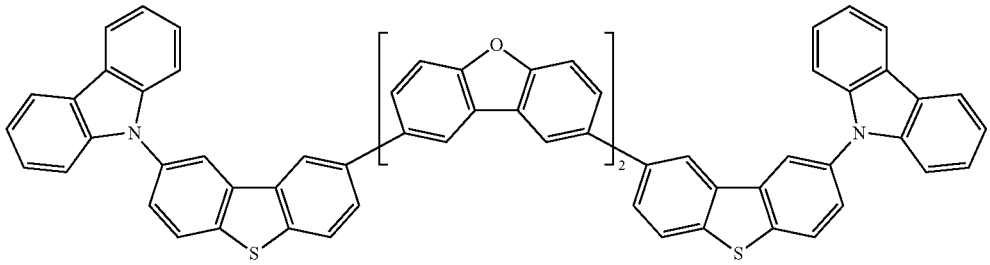

-continued
(31)
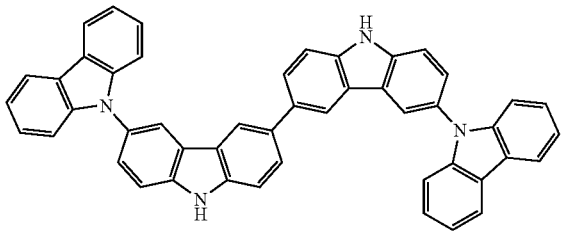
(32)
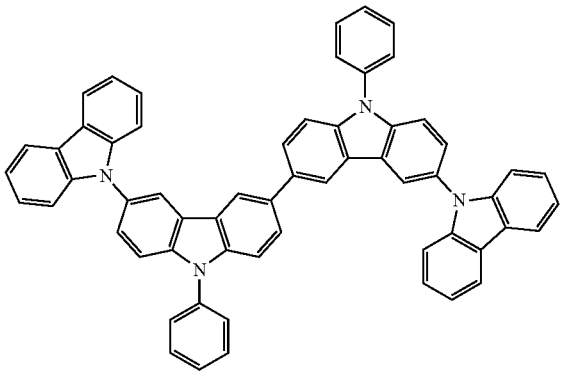
(33)
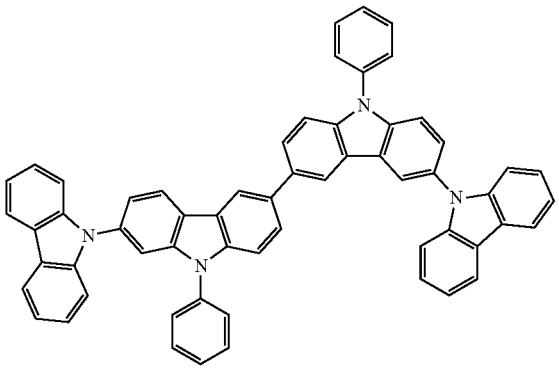
(34)
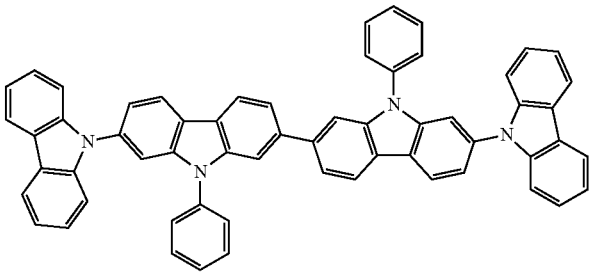
(35)
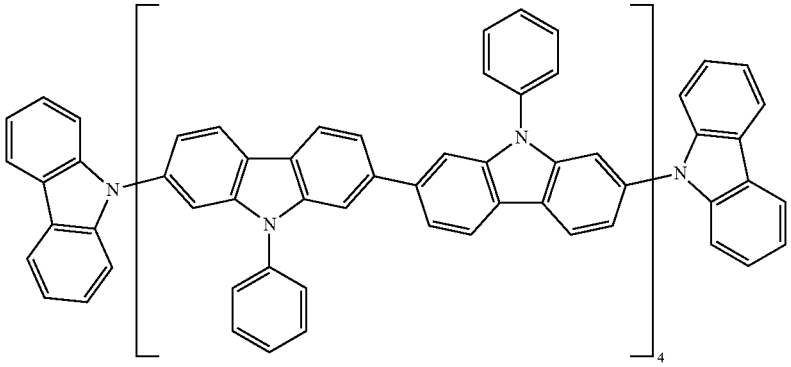
(36)
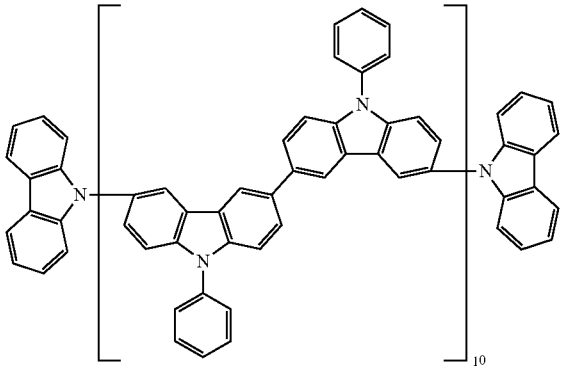
(37)
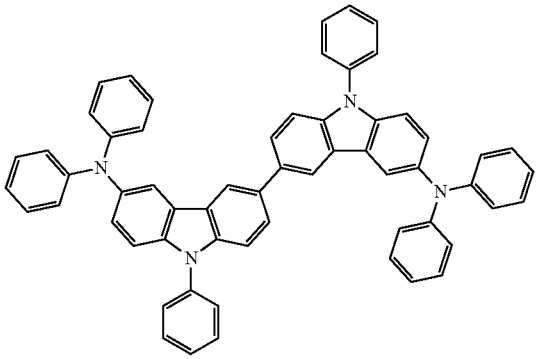

-continued
(38)
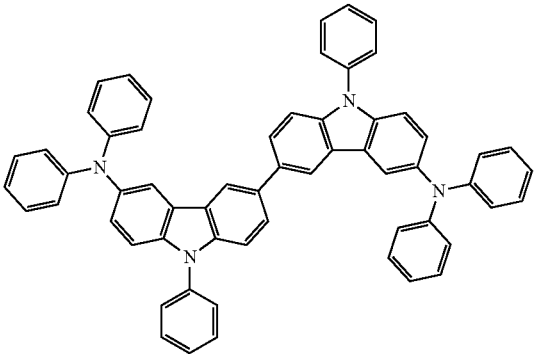
(39)
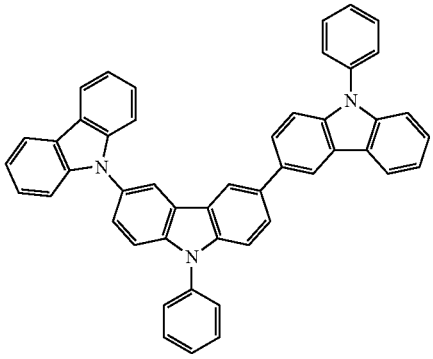
(40)
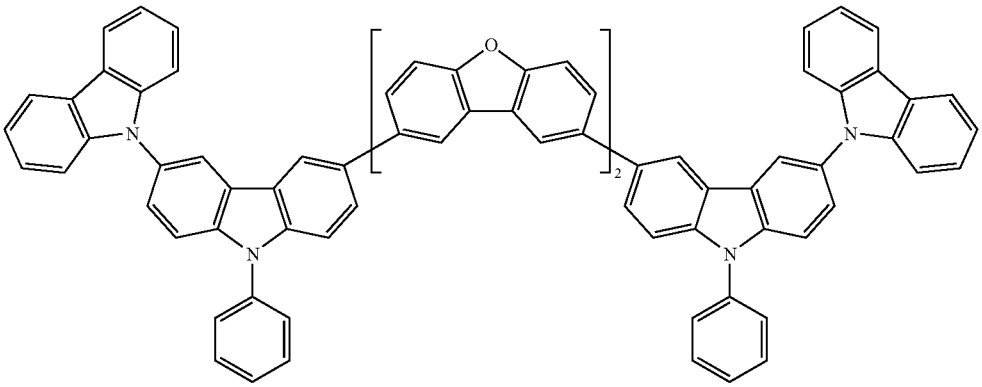
(41)
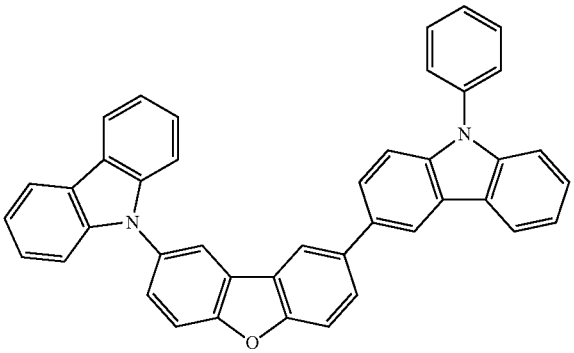
(42)
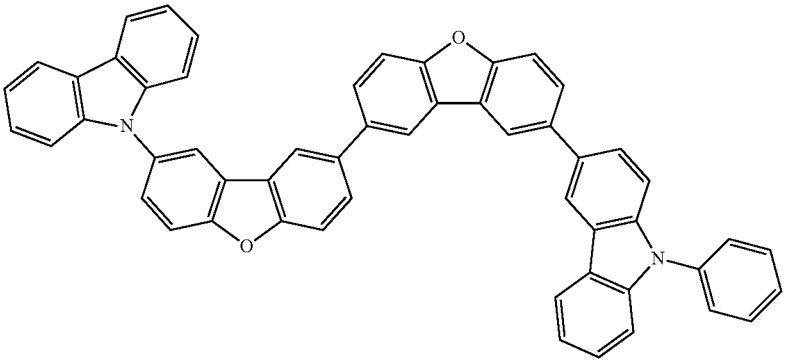

-continued (43)

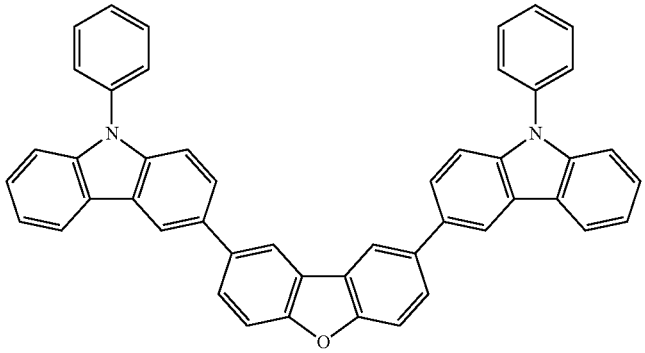

(44)

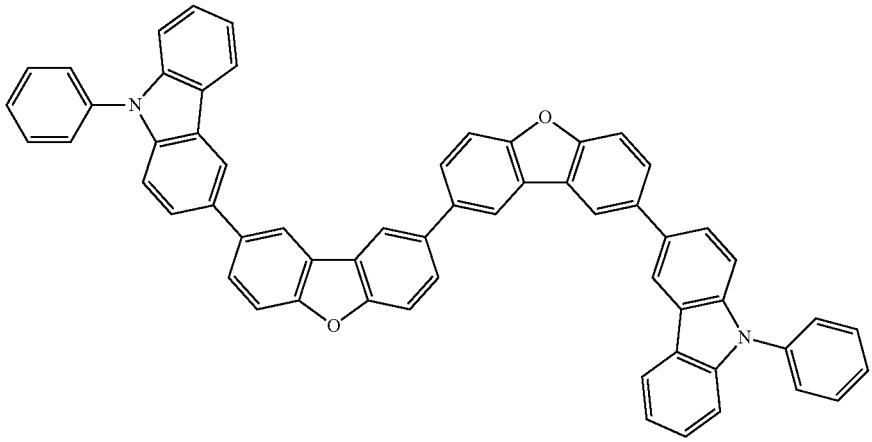

Constituent layers of an organic EL element of this invention will now be explained. Specific examples of a preferable layer constitution of an organic EL element of this invention are shown below; however, this invention is not limited thereto.

(i) anode/emission layer/electron transport layer/cathode, (ii) anode/positive hole transport layer/emission layer/electron transport layer/cathode, (iii) anode/positive hole transport layer/emission layer/positive hole inhibition layer/electron transport layer/cathode, (iv) anode/positive hole transport layer/emission layer/positive hole inhibition layer/electron transport layer/cathode buffer layer/cathode, (v) anode/anode buffer layer/positive hole transport layer/emission layer/positive hole inhibition layer/electron transport layer/cathode buffer layer/cathode, It is preferable that the organic EL element of the present invention incorporates monochromatic light emitting layers, namely a blue light emitting layer which emits light at a maximum wavelength in the range of preferably 430-480 nm, a green light emitting layer which emits light having a maximum wavelength in the range of preferably 510-550 nm, and a red light emitting layer which emits light having a maximum wavelength in the range of preferably 600-640 nm, and display devices are prepared employing the above. Further, these three layers may be laminated to prepare a white light emitting layer. Further, a non-light emitting interlayer may be incorporated between the light emitting layers. It is preferable that the organic EL element of the present invention is composed of a white light emitting layer and that illuminating devices are composed of the same.

Each layer which constitutes the organic EL element of the present invention will now be described.

<Anode>

As an anode according to an organic EL element of this invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. Further in the case of using a coatable material such as an organic conductive compound, a wet film-forming method such as printing and coating may be utilized. When emission is taken out of this anode, the transmittance is preferably set to not less than 10% and the sheet resistance as an anode is preferably not more than a few hundreds Ω/□. Further, although the layer thickness depends on a material, it is generally selected in a range of 10-1,000 nm and preferably of 10-200 nm.

<Cathode>

On the other hand, as a cathode according to this invention, metal (referred to as an electron injection metal), alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as electron injecting and oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum.

As for a cathode, these electrode substances may be made into a thin layer by a method such as evaporation or spattering. Further, the sheet resistance as a cathode is preferably not more than a few hundreds Ω/□ and the layer thickness is generally selected in a range of 10 nm-5 μm and preferably of 50-200 nm.

Herein, to transmit emission, either one of an anode or a cathode of an organic EL element is preferably transparent or translucent to improve the mission luminance.

Further, after preparing the above 1-20 nm thick metal film on the cathode, electrically conductive transparent materials listed in the description of the anode are applied thereon, whereby it is possible to prepare a transparent or translucent cathode. By employing this, it is possible to prepare an element in which both the anode and cathode exhibit transmitting properties.

An injection layer, an inhibition layer, and an electron transporting layer, which are employed as a constituting layer of the organic EL element of the present invention, will now be described.

<Injection Layer: Electron Injection Layer, Positive Hole Injection Layer>

An injection layer is appropriately provided and includes an electron injection layer and a positive hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30th 1998, published by N. T. S Corp.)", and includes a positive hole injection layer (an anode buffer layer) and an electron injection layer (a cathode buffer layer).

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1 nm-5 μm although it depends on a raw material.

<Inhibition Layer: Positive Hole Inhibition Layer, Electron Inhibition Layer>

Inhibition layer can be appropriately utilized in addition to basic constitution layers of a thin film comprising organic compounds as stated above.

For example, a positive inhibition layer described in such as JP-A Nos. 11-204258 and 11-204359 and p. 237 of "Organic EL Elements and Industrialization Front Thereof (Nov. 30 (1998), published by N. T. S Corp.)" is applicable to a positive hole inhibition (hole block) layer.

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron. Further, a constitution of an electron transport layer described later can be appropriately utilized as a positive hole inhibition layer according to this invention.

It is preferable that the positive hole inhibition layer of the organic EL element of the present invention is arranged adjacent to the light emitting layer. It is preferable that the positive hole inhibition layer incorporates the compounds represented by above Formula (A) and (1)-(3).

Further, in the present invention, in the presence of a plurality of light emitting layers which emit a plurality of different colors of light, it is preferable that the light emitting layer which emits the maximum amount of light of the shortest wavelength of all the light emitting layers, is nearest the anode. In such a case, it is preferable that a positive hole inhibition layer is additionally arranged between the above shortest wavelength light emitting layer and the light emitting layer which is nearest the anode, except for the above layer. Further, it is preferable that an ionization potential of at least 50% by weight of the compounds, incorporated in the positive hole inhibition layer arranged in the above position, is 0.3 eV higher than that of the host compounds of the above shortest wavelength light emitting layer.

Ionization potential is defined as energy required to transfer an electron in the highest occupied molecular orbital to the vacuum level, and is determined by the methods described below:

(1) it is possible to determine ionization potential in such a manner that the value, which is calculated by performing structural optimization by employing Gaussian 98 (Gaussian 98, Revision A. 11.4, M J. Frisch, et al., Gaussian, Inc., Pittsburgh Pa., 2002) and B3LYP/6-31G* as a key word, and the calculated value (being the value in terms of eV unit) is rounded off at the second decimal place. Background in which the above calculated value is effective is that the calculated values obtained by the above method and experimental values exhibit high correlation.

(2) it is also possible to obtain ionization potential via a direct measurement method employing a photoelectron spectroscopy. For example, it is possible to appropriately employ a low energy electron spectrometer "Model AC-1", produced by Riken Keiki Co., Ltd., or a method known as ultraviolet photoelectron spectroscopy.

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, a constitution of a positive hole transport layer described later can be appropriately utilized as an electron inhibition layer. The layer thickness of a positive hole inhibition layer and an electron transport layer of the present invention is preferably in a range of 3-100 nm, more preferably in a range of 5-30 nm.

<<Light Emitting Layer>>

The light emitting layer according to the present invention results in light emission via recombination of electrons and positive holes injected from the electrode or the electron transporting layer, and the positive hole transporting layer, and the light emitting portion may be in the interior of the light emitting layer or at the interface between the light emitting layer and the adjacent layer thereto.

The light emitting layer of the organic EL element of the present invention incorporates, as a host compound, the compounds represented by above Formula (A) and (1)-(3). In the present invention, simultaneously employed may be conventional host compounds.

In the present invention, a host compound is defined as a compound featuring a mass ratio of at least 20% in an emission layer based on all the compounds incorporated therein and exhibiting a phosphorescence quantum efficiency of less than 0.1 in terms of phosphorescence emission at room temperature (25° C.). The phosphorescence quantum efficiency is preferably less than 0.01.

Further, as the host compound, a plurality of conventional host compound may be used in combination. Using a plurality of host compounds at the same time makes it possible to adjust charge transfer and to enhance efficiency of an organic EL element. Still further, using a compound represented by the Formulas (A), (1)-(3), makes it possible to mix different emission light components, resulting in any given emission color. Emission of white color can be obtained by adjusting species of emitting metal complexes and dope amount and it is further usefully applied for a light sources or a backlight.

A specific emission host in combination use is preferably a compound having a positive hole transporting ability and an electron transporting ability, as well as preventing elongation of an emission wavelength and having a high Tg (a glass transition temperature).

As specific examples of an emission host compounds described in the following Documents are preferable:

For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

In the present invention, when a plurality of light emitting layers is incorporated, it is preferable that in view of ease of obtaining a uniform film state over the entire organic layer, at least 50% by weight of the host compounds in each layer are of the same compound. Further, it is preferable that the phosphorescence emitting energy of the above compound is at least 2.9 eV so that it becomes more advantageous to efficiently retard the energy transfer from the dopant to result in higher luminance.

"Phosphorescence emitting energy", as described in the present invention refers to the peak energy of the O-O transition band of phosphorescence emission which is obtained by determining photoluminescence of a 100 nm vapor deposition film of the host compound on a substrate.

It is preferable that the phosphorescence emitting energy and Tg of host compounds employed in the present invention are at least 2.9 eV and at least 90° C., respectively. When the Tg is at most 90° C., deterioration (a decrease in luminance and degradation of film state) of the element during storage is marked, resulting in not meeting market needs as a light source. Namely, in order to satisfy both luminance and durability, those which exhibit the phosphorescence emitting energy of at least 2.9 eV and a Tg of at least 90° C. are preferred. Tg is more preferably at least 100° C.

In the present invention, when a plurality of light emitting layers is incorporated, it is preferable that at least 50% by weight of the host compounds in the light emitting layer are the same compound which exhibits a phosphorescence emitting energy of at least 2.9 eV and Tg of at least 90° C. Surprisingly, it was discovered that even though each material which exhibits excellent durability is employed, when a different compound is employed in each layer, storage characteristics of the entire element are occasionally degraded compared to the case in which the same compound is employed in all light emitting layers.

This cause is not yet fully understood, however, the cause is assumed to be as follows. When 50% by weight of host compounds in all light emitting layers are the same, namely, when the host compounds of all light emitting layers are substantially the same, a uniform film surface state tends to be obtained. When different compounds are employed in each light emitting layer, even though each compound is stable, non-uniformity tends to occur at the layer interface.

Phosphorescence emitting metal complexes are compounds which results in observed of light emission from the excited triplet, emit phosphorescence at room temperature (25° C.), and exhibit a phosphorescent quantum yield of at least 0.01 at 25° C.

The phosphorescent quantum yield is preferably at least 0.1. It is possible to determine the above phosphorescent quantum yield via the method described on page 398 of Bunko (Spectroscopy) II of Dai 4 Han Jikken Kagaku Koza (4th Edition Experimental Chemistry Lectures) 7 (1992 Edition, Maruzen).

It is possible to determine the phosphorescent quantum yield in a solution by employing various solvents. The phosphorescence emitting metal complexes may be employed in the present invention as long as they result in the above phosphorescent quantum yield in any of the solvents.

The light emitting principle of phosphorescence emitting metal complexes is of two types: one is an energy transfer type in which carriers undergo recombination on the host compounds to which carriers are transported to generate an excited state of the host compounds and by transferring the resulting energy to phosphorescence emitting complexes, light emission is obtained, and the other is a carrier trap type in which phosphorescence emitting metal complexes work as a carrier trap and carriers undergo recombination on the phosphorescence emitting metal complexes, whereby it is possible to obtain light emission from the phosphorescence emitting metal complexes. In either case, an essential condition is that energy of the excited state of phosphorescence emitting metal complexes is lower than that of the excited state of host compounds.

Phosphorescence emitting metal complexes according to the present invention are exemplified below. Those which are preferably employed are complexes and those which are more preferably employed are Ir complexes which have 2-phenylimidazole derivatives as a ligand.

Ir-1
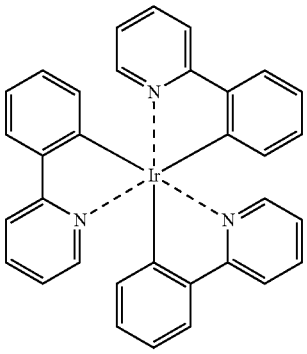
Ir-2
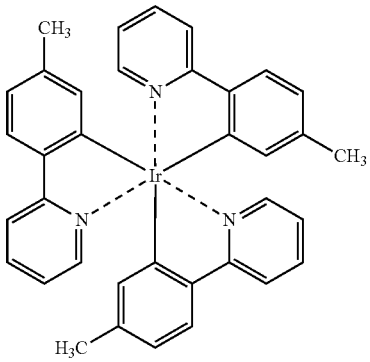
Ir-3
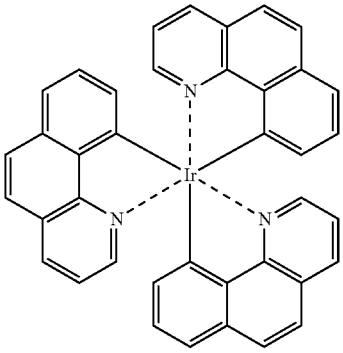
Ir-4
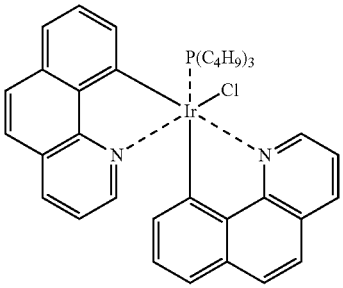
Ir-5
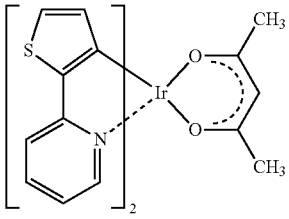
-continued
Ir-6
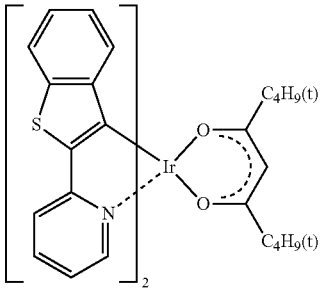
Ir-7
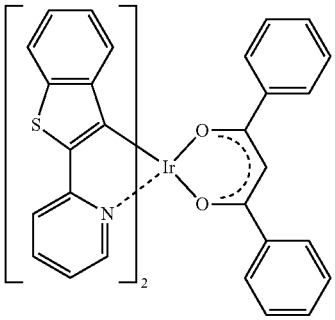
Ir-8
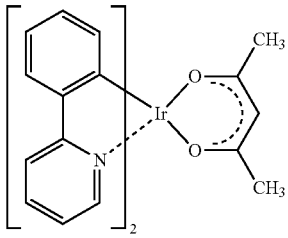
Ir-9
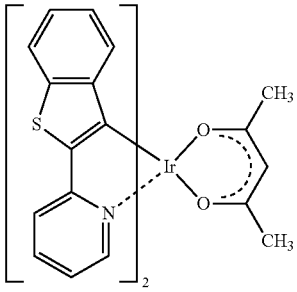
Ir-10
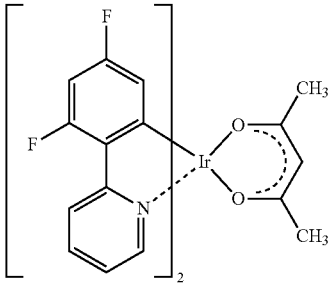

-continued
Ir-11
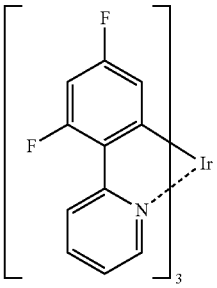
Ir-12
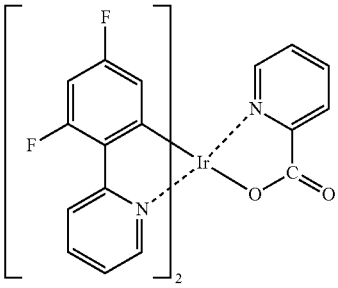
Ir-13
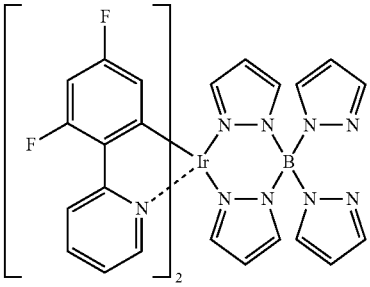
Ir-14
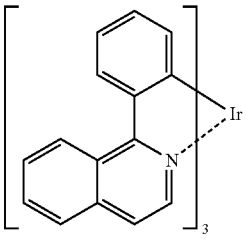
Ir-15
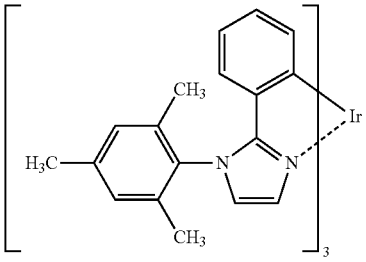
Ir-16
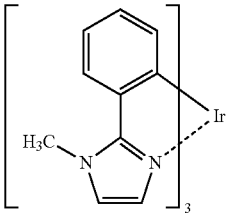
-continued
Pt-1
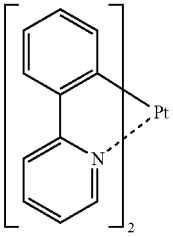
Pt-2
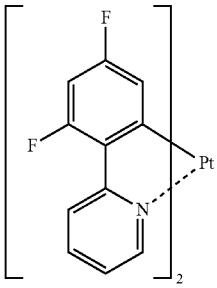
Pt-3
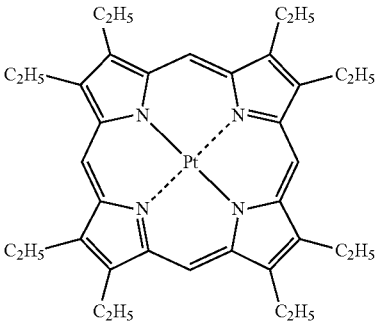
A-1
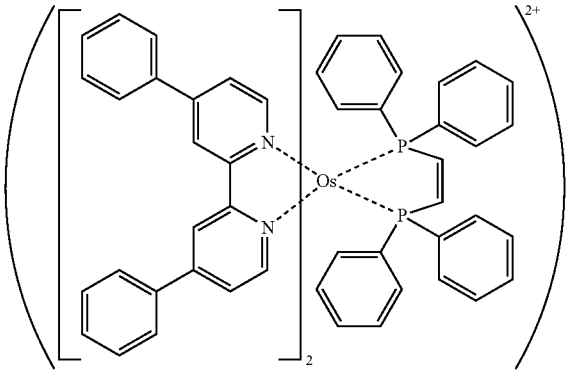
$(CF_3CF_2CF_2COO^-)_2$ -continued
D-1
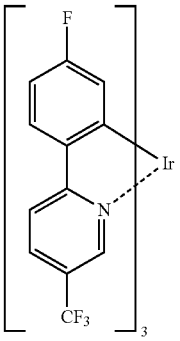
D-2
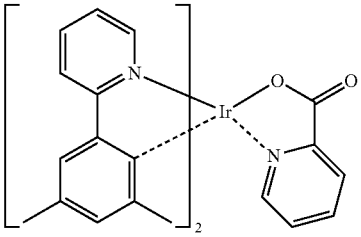
D-3
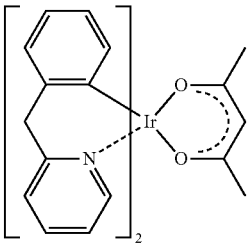
D-4
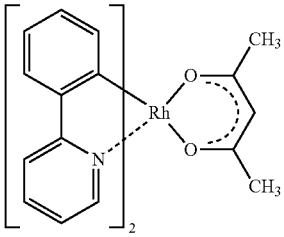
D-5
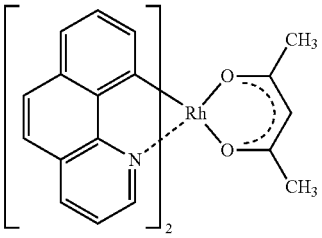
D-6
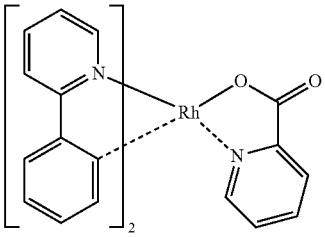
-continued
Pd-1
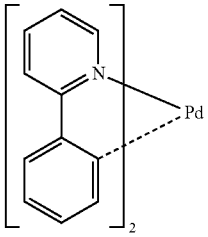
Pd-2
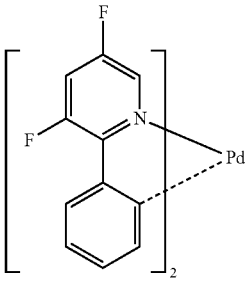
Pd-3
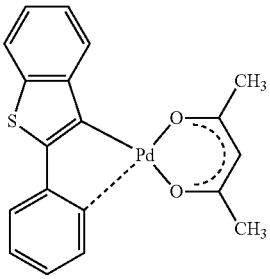
Rh-1
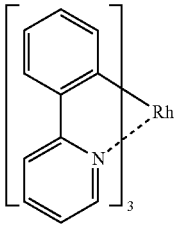
Rh-2
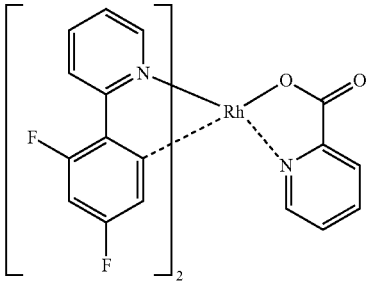
Rh-3
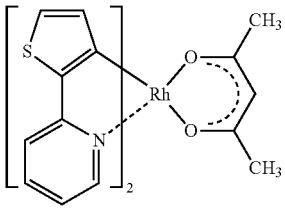

-continued
2-1
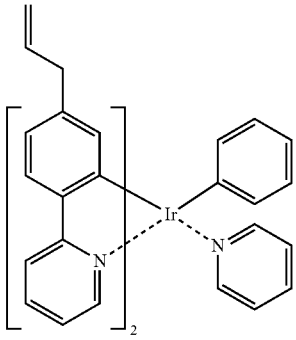
2-2
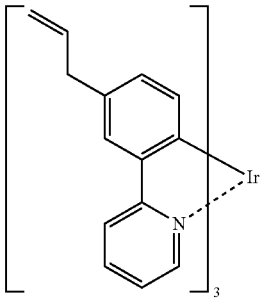
2-3
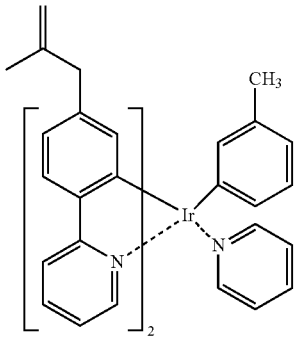
2-4
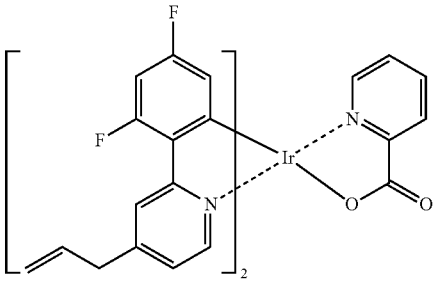
2-5
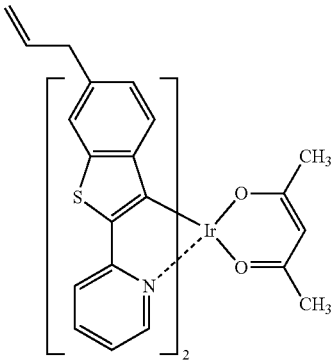
-continued
2-6
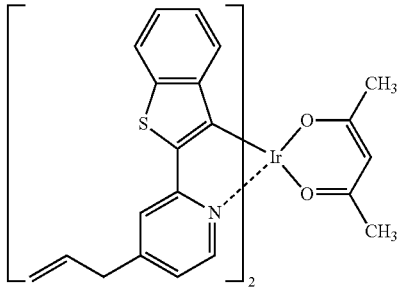
2-7
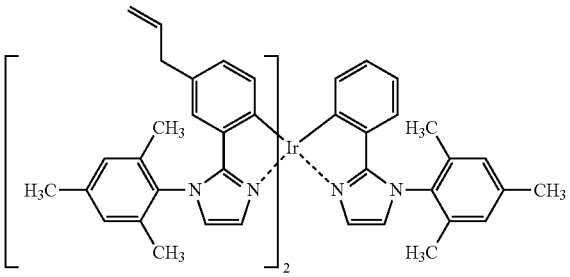
2-8
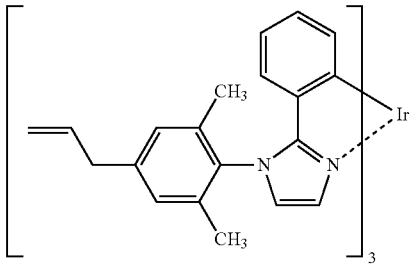
2-9
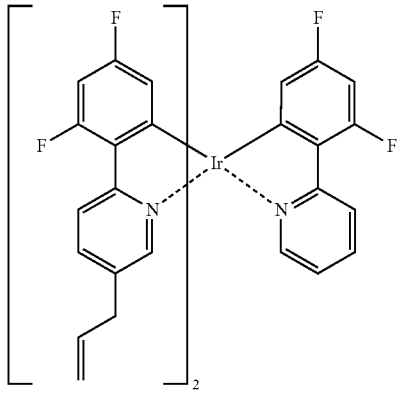
2-10
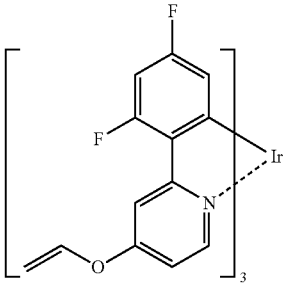

-continued 2-11

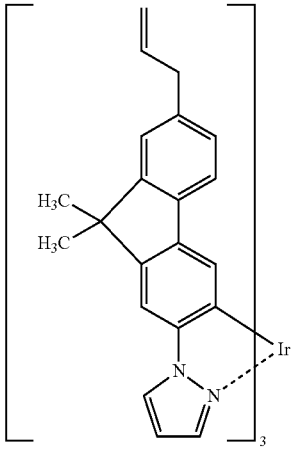

2-12

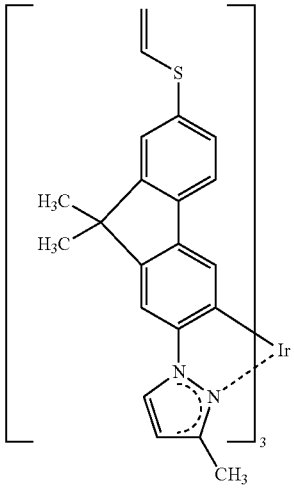

2-13

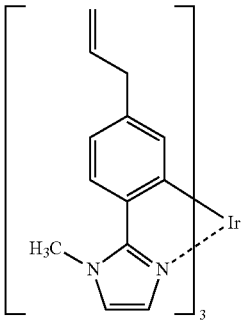

2-14

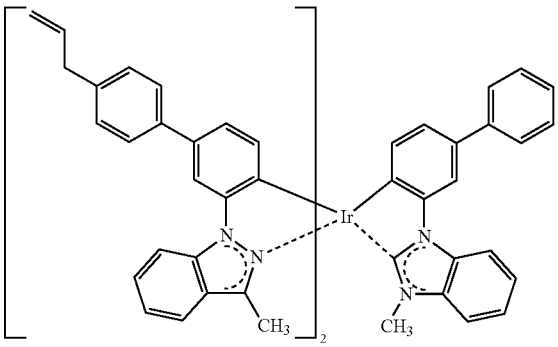

-continued 2-15

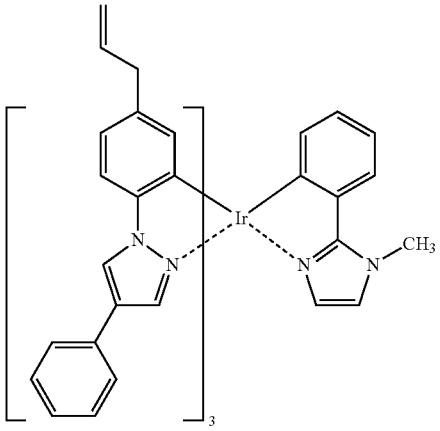

2-16

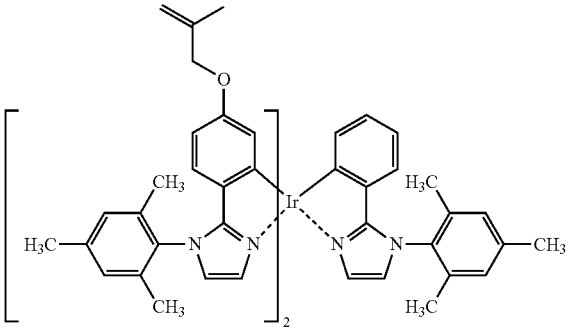

It is possible to synthesize these compounds with reference to the methods described, for example, in Inorg. Chem. Volume 40, 1704-1711.

In the present invention, the maximum wavelength of phosphorescence emitted by phosphorescence emitting organic metal complexes is not particularly limited. In principle, it is possible to change the wavelength of emitted light by appropriately selecting the central metal, the ligand, and the substituent of the ligand.

Color of light emitted from the organic EL elements of the present invention and the compounds according to the present invention is specified in such a manner that results determined by spectroradiometric luminance meter CS-1000 (produced by Konica Minolta Sensing Inc.) are applied to the CIE chromaticity coordinates in FIGS. 4 and 16 on page 108 of "Shinpen Shikisai Kagaku Handbook (New Edition Color Science Handbook") (edited by The Color Science Association of Japan, University of Tokyo Press, 1955).

"White element", as described in the present invention, means that when front luminance of a viewing angle of 2° C. is determined via the above method, chromaticity in the CIE 1931 Chromaticity System at 1,000 Cd/$m^2$ is in the range of X=0.33±0.07 and Y=0.33±0.07.

It is possible to form the light emitting layer in such a manner that the above compounds are modified to a film employing the conventional thin film producing methods such as a vacuum deposition method, a spin coating method, a casting method, an LB method, or an ink-jet method.

In the present invention, the light emitting layer incorporates layers which differ in spectra of the emitted light so that the wavelength of each maximum emitted light is in the range of 430-480 nm, 510-550 nm and 600-640 nm, or a layer composed of the those laminated layers.

Laminated layer order in the light emitting layer is not particularly limited, and a non-light emitting interlayer may be provided between the light emitting layers. In the present invention, it is preferable that of all light emitting layers, at least one blue light emitting layer is provided in the position which is nearest to the anode.

Further, when at least four light emitting layers are arranged, in order to enhance luminance stability, it is preferable to laminate layers in the anode-near order of blue, green, and red, such as blue/green/red/blue, blue/green/red/blue/green, or blue/green/red/blue/green/red.

The total thickness of light emitting layers is not particularly limited. In view of enhancement of homogeneity of the film and enhancement of stability of emitted light color against driving electric current while emitting light at low voltage, the above thickness is selected to be preferably in the range of 2 nm-5 μm, but to be more preferably in the range of 2-200 nm. In the present invention, the thickness is most preferably in the range of 10-20 nm.

Thickness of each light emitting layer is selected to be preferably in the range of 2-100 nm, but to be more preferably in the range of 2-20 nm. The relationship of thickness of each of the blue, green, and red light emitting layer is not particularly limited. However, it is preferable that of the three light emitting layers, the blue light emitting layer is thickest (in the case of presence of a plurality of blue layers, the total thickness).

Further, a plurality of light emitting compounds may be blended in each light emitting layer in a range in which the above emission maximum wavelength is maintained. For example, blended in the blue light emitting layer may be blue light emitting compounds exhibiting a maximum emission wavelength of 430-480 nm and green light emitting compounds exhibiting a maximum emission wavelength of 510-550 nm.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, a arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N, N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NPD), and 4,4',4"-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized.

Further, an inorganic compound such as a p type-Si and a p type-SiC can be utilized as a positive hole injection material and a positive hole transport material.

Further, it is possible to employ so-called p-type positive hole transporting materials which are described in JP-A No. 11-251067 and J. Huang et al., report (Applied Physics Letters 80 (2002). P. 139). In the present invention, since it is possible to prepare a more efficient light emitting element, it is preferable to employ these materials.

This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, is generally 5 nm-5 μm, preferably 5-200 nm. This positive transport layer may have a single layer structure comprised of one or not less than two types of the above described materials.

Further, it is possible to employ an impurity-doped positive hole transporting layer exhibiting high "p" property. As such examples, listed are those described in each of JP-A Nos. 4-297076, 2000-196140, and 2001-102175, as well as J. Appl. Phys., 95, 5773 (2004).

In the present invention, it is preferable to employ such a positive hole transporting layer exhibiting high "p" property, since it is possible to prepare an element which results in low electrical power consumption.

<Electron Transport Layer>

An electron transfer layer is comprised of a material having a function to transfer an electron, and an electron injection layer and a positive hole inhibition layer are included in an electron transfer layer in a broad meaning. A single layer or plural layers of an electron transfer layer may be provided.

In case of utilizing in a single electron transport layer and a plurality of layers, an electron transfer material in an electron transport layer arranged adjacent to cathode (combining in a hole inhabitation material) is provided with a function to transmit an electron injected from a cathode to an emission layer, and compounds conventionally well known in the art can be utilized by arbitrarily selection as a material thereof, for examples, a nitro-substituted fluorene derivative, a diphenylquinone derivative, a thiopyradineoxide derivative, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Further polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material.

This electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, is generally 5 nm-5 μm, and preferably 5-200 nm. This electron transport layer may have a single layer structure comprised of one or not less than two types of the above described materials.

Further, it is possible to employ an impurity-doped electron transporting layer exhibiting high "n" property. Examples thereof include those described in JP-A No. 4-297076, 10-270172, 2000-196140, and 2001-102175, as well as J. Appl. Phys., 95, 5773 (2004).

In the present invention, it is preferable to employ such an electron transporting layer exhibiting high "n" property, since it is possible to prepare an element winch results in low electrical power consumption.

<Substrate>

A substrate (also referred to as Base Plate, Base Material or Support) according to an organic EL element of the present invention is not specifically limited with respect to types of such as glass and plastics provided being transparent, however, a substrate preferably utilized includes such as glass, quartz and transparent resin film. A specifically preferable substrate is resin film capable of providing an organic EL element with a flexible property.

Resin film includes such as film comprised of a polyester such as polyethylene terephthalate (PET) and polyethylene naphthalate (PEN); polyethylene, polypropyrene, a cellulose ester or a cellulose ester derivative such as cellophane, cellulose diacetate, cellulose triacetate, cellulose acetate butylate, cellulose acetate propionate (CAP), cellulose acetate phtalate (TAC), cellulose nitrate; poly vinylidene chloride, polyvinyl alcohol, polyethylene vinylalcohol, syndiotactic polystyrene, polycarbonate, norbornene resin, polymethyl pentene, polyether ketone, polyimide, polyether sulphone (PES), polyphenylene sulfide, polysulphones, polyether imide, polyether ketone imide, poly amide, fluorine contained resin, nylon, polymethylmethacrylate, acrylates or polyacrylates, ARTON (Product by JSR Corporation), and cyclo olefin resin such as APEL(Product name by Mitsui Chemicals, Inc).

On the surface of resin film, an inorganic or organic cover layer or a hybrid cover layer comprising the both may be formed, and the film is preferably provided with a high barrier ability. A preferably barrier film has a moisture permeability of not more than 0.01 g/($m^2$·24 hr)·at a temperature of 25±0.5° C., relative humidity (90±2) % RH measured based on JIS K 7129-1992, and more preferably an oxygen permeability of not more than $1\times10^{-3}$ ml/($m^2$·24 hr·MPa) measured based on JIS K 7126-1987 and a moisture permeability of not more than $1\times10^{-5}$ g/($m^2$·24 hr).

As barrier film forming materials, employed may be those which function to retard invasion of materials, such as moisture or oxygen, which deteriorate the element. It is possible to employ, for example, silicon oxide, silicon dioxide and silicon nitride. Further, to improve brittleness of the above film, it is preferable to result in a laminated layer structure composed of these inorganic layers and organic materials. The order of laminated inorganic layers and organic layers is not particularly limited, but it is preferable that both are alternately laminated several times.

Forming methods of barrier films are not particularly limited, and it is possible to employ, for example, a vacuum deposition method, a sputtering method, a reactive sputtering method, a molecular beam epitaxy method, a cluster ion beam method, an ion plating method, a plasma polymerizing method, an atmospheric pressure plasma polymerizing method, a plasma CVD method, a laser CVD method, a thermal CVD method, and a coating method. The atmospheric pressure plasma polymerizing method, described in JP-A No. 2004-68143, is particularly preferred.

Examples of opaque substrates include metal plates composed of aluminum or stainless steel, films, opaque resin substrates, and ceramic substrates.

The exterior taking-out efficiency of light emitted by an organic EL element is preferably at least 1%, but is more preferably at least 5%. Herein, exterior taking-out quantum yield (in %)=number of photons which are emitted to the exterior of an organic EL element/number of electrons which are flown to the organic EL element×100.

Further, simultaneously employed may be hue improving filters such as color filters or color conversion filters which modify the color of light emitted from an organic EL element to multicolor, employing phosphors. When color conversion filters are employed, the λmax of light emitted by the organic EL element is preferably at most 480 nm.

<<Sealing>>

An example of a sealing method employed in the present invention may include a method in which a sealing member and an electrode, or a substrate are adhered via adhesive agents.

The sealing member may be arranged to cover the display portion of an organic EL element, and may be either a concave plate or a flat plate. Further, its transparency and electric insulation are of no particular concern.

Specifically listed are glass plates, polymer plate-films, and metal plate-films. Glass plates may specifically include soda lime glass, barium-strontium containing glass, lead glass, aluminosilicic acid glass, boron silicic acid glass, barium silicic acid glass, and quartz glass. Further, listed as polymer plates may be those composed of polycarbonate, acryl, polyethylene terephthalate, polyether sulfide, and polysulfone. Metal plates include those composed of at least one selected from the group consisting of stainless steel, iron, copper, aluminum, magnesium, nickel, zinc, chromium, titanium, molybdenum, silicon, germanium, and tantalum.

In the present invention, in view of the capability of modifying an element to a thin film, it is preferable to employ polymer films and metal films. Furthermore, it is preferable that the polymer films exhibit an oxygen permeability of at most $1\times10^{-3}$ ml/($m^2$·24 hours·MPa), determined by the method based on JIS K 7126-1987, and a moisture permeability (at 25±0.5° C. and relative humidity of 90±2%) of $10^{-5}$ g/($m^2$·24 hours), determined by the method based on JIS K 7129-1992.

In order to form concave modify sealing members, employed are a sand blasting process or a chemical etching process.

Specific adhesive agents may include photocurable and thermally curable type adhesive agents having a reactive vinyl group of acrylic acid oligomers and methacrylic acid oligomers, as well as moisture curable type adhesive agents such as 2-cyanoacrylic acid esters. Further listed may be thermally and chemically curable types (being a two-liquid mixture) such as epoxy based ones. Further listed may be hot-melt type polyamides, polyesters, and polyolefin. Still further listed may be cationically curable type ultraviolet ray curable type epoxy resin adhesive agents.

Since organic EL elements occasionally deteriorate due to thermal processing, preferred are those which enable adhesion curing between room temperature and 80° C. Further, desiccating agents may be dispersed into the above adhesive agents. Adhesive agents may be applied to sealing portions employing a commercial dispenser, or may be printed in the same manner as screen printing.

Further, it is appropriate to prepare a sealing film by forming inorganic material and organic material layers which come into contact with a substrate in such a manner that on the exterior of an electrode which interposes an organic layer and faces the substrate, the above electrode and an organic layer are thereby covered. In such case, materials to form the above film may be employable as long as they retard invasion of those, such as moisture or oxygen, which result in deterioration of the elements. For example, employed may be silicon oxide, silicon dioxide, or silicon nitride. Further, in order to minimize brittleness of the above film, it is preferable to form a laminated layer structure composed of these inorganic layers and layers composed of organic materials. Formation methods of these films are not particularly limited, and examples thereof may include a vacuum deposition method, a sputtering method, a reactive sputtering method, a molecular beam epitaxy method, a cluster ion beam method, an ion plating method, a plasma polymerizing method, an atmospheric pressure plasma polymerizing method, a plasma CVD method, a laser CVD method, a thermal CVD method, and a coating method.

It is preferable that in a gas or liquid phase, inert gases such as nitrogen or argon, or inert liquids such as fluorinated hydrocarbon or silicone oil are injected into the space between the sealing member and the display region. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); and perchlorates (for example, barium perchlorate and magnesium perchlorate). Of the sulfates, metal halides, and perchlorates, anhydrous salts thereof are appropriately employed.

<<Protective Films and Protective Plates>>

In order to enhance mechanical strength of elements, a protective film or plate may be arranged on the exterior of the above sealing film which interposes the organic layer and faces the substrate or the above sealing film. Specifically, when sealing is carried out via the above sealing film, its mechanical strength is not always sufficient. Consequently, it is preferable to arrange such a protective film or plate. Employable materials include glass plate, polymer plate-film, and metal plate-film which are the same as those employed for the above sealing. In view of light weight and capability of forming a thin film, it is preferable to employ a polymer film.

<<Light Taking-Out>>

It is generally stated that with regard to an organic EL element, light is generated in the interior of the layer of a higher refractive index (a refractive index of 1.7-2.1) than that of air and of light generated in the light emitting layer, only about 15% to about 20% of the light is taken out. The reasons are that light which is incident to the interface (the interface between the transparent substrate and air) at angle θ, which is greater than the critical angle, is not taken out of the element due to total reflection, while all light is reflected between the transparent electrode or the light emitting layer and the transparent substrate, and light is channeled to the transparent electrode or the light emitting layer, whereby light escapes to the element side direction.

Examples of methods to enhance the light taking-out efficiency include: a method in which asperity is formed on the surface of a transparent substrate and total reflection at the interface between the transparent substrate and air is minimized (U.S. Pat. No. 4,774,435), a method in which a light collecting substrate is used (JP-A No. 63-314795), a method in which a reflective surface is formed on the side surface of an element (JP-A No. 1-220394), a method in which a flat layer of an intermediate refractive index is introduced between a substrate and a light emitting body, whereby an antireflective film is formed (JP-A No. 62-172691), a method in which between a substrate and a light emitting body introduced is a flat layer of a refractive index which is lower than that of the above substrate (JP-A No. 2001-202827), and a method in which diffraction gratings are formed between any of a substrate, a transparent electrode layer, and a light emitting layer (including between a substrate and an exterior) (JP-A No. 11-283751).

In the present invention, it is possible to employ any of the above methods in combination with the organic EL element of the present invention, and it is possible to appropriately employ the method which introduces a flat layer of a refractive index which is lower than that of the substrate between the above substrate and the light emitting body, or the method in which diffraction gratings are formed between the substrate and either the transparent electrode layer or the light emitting layer (including between the substrate and the exterior.

In the present invention, by combining these methods, it is possible to prepare an element which exhibits higher luminance or higher durability.

When a medium of a low refractive index is formed at a thickness which is greater than the light wavelength between the transparent electrode and the transparent substrate, taking-out efficiency of light emitted from the transparent electrode increases as the refractive index of the medium decreases.

Examples of layers of a low refractive index include aerogels, porous silica, magnesium fluoride, and fluorine based polymers. Since the refractive index of the transparent substrate is commonly about 1.5-about 1.7, the refractive index of low refractive index layers is preferably at most about 1.5, but is more preferably at most 1.35.

Further, the thickness of low refractive index media is preferably at least twice the wavelength in media. The reason for this is that the thickness of low refractive index media roughly approaches the light wavelength so that electromagnetic wave permeated via evanescent enters the substrate, whereby effects of the low refractive index layer are decreased.

The method which employs an interface which results in total reflection or introduces diffraction gratings into media exhibits features which result in a high effect to enhance light taking-out efficiency. These methods are achieved as follows. By utilizing properties of the so-called Bragg diffraction in which diffraction gratings result in primary diffraction and secondary diffraction so that it is possible to change light direction to the specified direction which is different from the diffraction, of light generated from the light emitting layer, light which is not able to going out due to the total reflection between the layers is diffracted at the interface between any layers or by introducing diffraction gratings into media (within the transparent substrate or within the transparent electrode), whereby light is introduced into the exterior.

It is preferable that the introduced diffraction gratings exhibit two-dimensional cyclic refractive indices. The reason is that since the light emitting layer randomly emits light in all directions, a common one-dimensional diffraction grating, which carries a cyclic refractive index distribution only in a certain direction, diffracts light only in the specified direction, whereby light taking-out efficiency is not so enhanced. However, by changing the refractive index distribution to a two-dimensional distribution, light is diffracted in all directions to enhance the light taking-out efficiency.

As noted above, the diffraction grating may be positioned at the interface between any layers or in a medium (in a transparent substrate or a transparent electrode), but is preferably positioned adjacent to the organic light emitting layer where the light is generated.

At the time, the cycle of the diffraction grating is preferably by a factor of about ½ to about 3 of the light wavelength in the medium.

It is preferable that the arrangement of detraction gratings is two-dimensionally repeated to result in a square lattice, a triangular lattice or a honeycomb lattice.

<<Light Collecting Sheet>>

With regard to the organic EL element of the present invention, it is possible, for example, to enhance luminance in a specified direction by collecting light in a specified direction such as toward the front with respect to the light emitting element surface by forming a micro-lens array structure or by combining it with a so-called light-collecting sheet.

The micro-lens array is, for example, formed in such a manner that quadrangular pyramids of a side length of 30 μm and an apex angle of 90 degrees are two-dimensionally arranged on the light taking-out side of a substrate. The side length is preferably 10-100 μm. When the length is less then the lower limit, diffraction effects occur to result in coloring, while when it is more than the upper limit, the undesirable thickness results.

It is possible to employ, as the light collecting sheet, ones which are commercially employed, for example, as in LED backlights of liquid crystal display devices. It is possible, for example, to employ, as such sheets, luminance enhancing film (BEF), produced by Sumitomo 3M Ltd. Examples of the shape of the prism sheet may include ones in which Δ shaped stripes of an apex angle of 90 degrees and a pitch of 50 μm are formed on a substrate and the others such as a shape in which the apex angle is rounded, a shape in which the pitch is randomly changed or other appropriate shapes.

Further, in order to control the light radiation angle from the light emitting element, a light diffusing plate-film may be simultaneously employed with a light collecting sheet. For example, it is possible to employ the diffusion film (LIHGT-UP) produced by Kimoto Co., Ltd.

<<Preparation Method of Organic EL Elements>>

As one example of the preparation method of the organic EL element of the present invention, described will be a preparation method of the organic EL element composed of an anode/positive hole injecting layer/positive hole transporting layer/light emitting layer/electron transporting layer/electron injecting layer/cathode.

Initially, a thin film of a thickness of at most 1 μm, but preferably 10-200 nm, which is composed of desired electrode compounds such as anode compounds, is formed on an appropriate substrate, employing a method such as a vapor deposition or sputtering method, whereby an anode is prepared.

Subsequently, on the above film, formed is a thin organic compound layer composed of a positive hole injecting layer, a positive hole transporting layer, a light emitting layer, an electron transporting layer, and positive hole inhibition layer.

As noted above, methods to form each of these layers include a vapor deposition method, as well as wet processes (such as a spin coating method, a casting method, an ink-jet method, or a printing method). In the present invention, in view of ease of formation of a homogenous film and reduced formation of pin holes, preferred is film formation employing methods such as a spin coating method, an ink-jet method, or a printing method, but the ink-jet is particularly preferred.

In the present invention, during formation of a light emitting layer, it is preferable that a film is prepared via a coating method employing a liquid composition in which the organic metal complexes according to the present invention are dissolved or dispersed, and the coating method is preferably the ink-jet method.

As liquid media in which the organic metal complexes according to the present invention are dissolved or dispersed, employed may, for example, be ketones such as methyl ethyl ketone or cyclohexanone; aliphatic acid esters such as ethyl acetate; halogenated hydrocarbons such as dichlorobenzene; and organic solvents such as DMF or DMSO. Further, it is possible to achieve dispersion via dispersing methods employing ultrasonic waves, high shearing force dispersion, or media dispersion.

After forming these layers, in order to form a cathode, a thin layer of at most 1 μm, composed of cathode compounds, is applied onto the above layers to result in a layer thickness in the range of 50-200 nm via a vapor deposition or sputtering method, whereby a desired organic EL element is prepared.

Further, by reversing the preparation order, it is possible to achieve preparation, in the order of a cathode, an electron injecting layer, an electron transporting layer, a positive hole transporting layer, a positive hole injecting layer, and an anode. When direct electric current voltage is applied to the multicolor display device prepared as above, application of voltages of 2-40 V, employing the anode as + and the cathode as −, makes it possible to observe light emission. Further, alternating current voltage may be applied, and the waveform of the applied alternating electric current is not limited.

<<Application>>

It is possible to employ the organic EL element of the present invention as various light emitting light sources.

Examples of such light emitting light sources include, but are not limited to, home illumination, car interior illumination, backlights for watches and liquid crystals, advertising displays, signals, light sources for optical memory media, light sources for electrophotographic copiers, light sources for optical communication processors, and light sources for optical sensors. Of these, it is possible to effectively employ the above EL element for use as a backlight of liquid crystal display devices and light sources for illumination.

If desired, the organic EL element of the present invention may be subjected during film production to patterning via a metal masking or ink-jet printing method. When the above patterning is carried out, only the electrode may be subjected to patterning, the electrode and the light emitting layer may be subjected to patterning, or all layers of the element may be subjected to the above patterning.

EXAMPLES

The present invention will now be described with reference to examples, however the present invention is not limited thereto.

Example 1

<Preparation of Organic EL Elements 1-1 through 13>

After applying patterning to a substrate (NA45, produced by NH Techno Glass Corp.) which was treated in such a way that ITO (indium tin oxide), as an anode, was applied onto a 100 mm×100 mm×1.1 mm glass substrate to form a 100 nm film, the transparent substrate provided with the above transparent ITO electrode was subjected to ultrasonic cleaning employing isopropyl alcohol, was dried in desiccated nitrogen gas, and was subjected to UV ozone cleaning for 5 minutes. The resulting transparent substrate was adhered onto the substrate holder of a commercial vacuum deposition apparatus. On the other hand, 200 mg of α-NPD was placed in a molybdenum resistance heating boat, 200 mg of CBP as a host compound was placed in another molybdenum resistance heating boat, 200 mg of basocuproin (BCP) was placed in further another molybdenum resistance heating boat, 100 mg of Ir-12 was placed in still another molybdenum resistance heating boat, and 200 mg of $Alq_3$ was placed in yet another molybdenum resistance heating boat. These boats were then fitted onto the vacuum deposition apparatus. Subsequently, after lowering the pressure of a vacuum tank to $4\times10^{-4}$ Pa, the above boat incorporating α-NPD was heated via electric current and vapor deposition was applied onto the transparent substrate at a deposition rate of 0.1 nm/second, whereby a 40 nm thick positive hole transporting layer was produced.

Further, the above heating boats, respectively incorporating CBP and Ir-12, were heated via electric current and co-deposition was applied onto the above positive hole transporting layer at a deposition rate of 0.2 nm/second and 0.012 nm/second, respectively, whereby a 40 nm thick light emitting layer was produced. The substrate temperature during deposition was at room temperature.

Further, the above heating boat incorporating BCP was heated via electric current and deposition was applied onto the above light emitting layer at a deposition rate of 0.1 nm/second, whereby a 40 nm thick positive hole inhibition layer was produced.

Still further, the above heating boat incorporating $Alq_3$ was heated via electric current and deposition was applied onto the above positive hole inhibition layer at a deposition rate of 0.1 nm/second, whereby a 40 nm thick electron transporting layer was further produced. The substrate temperature during deposition was at room temperature.

Subsequently, 0.5 nm lithium fluoride and 110 nm aluminum each was deposited to form a cathode, whereby Organic EL Element 1-1 was prepared.

Organic EL Elements 1-2 through 1-13 were prepared in the same manner as Organic EL Element 1-1, except that CBP employed as the host compound of the light emitting layer was replace with each of the compounds listed in Table 1 as a host compound. Structures of the compounds employed in the above are shown below.

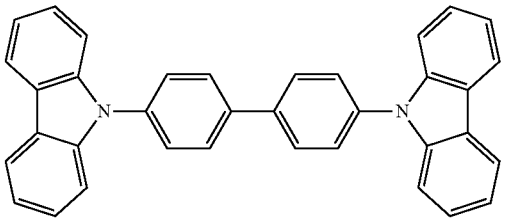

CBP

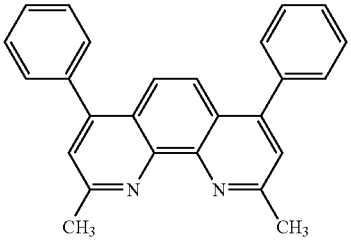

BCP

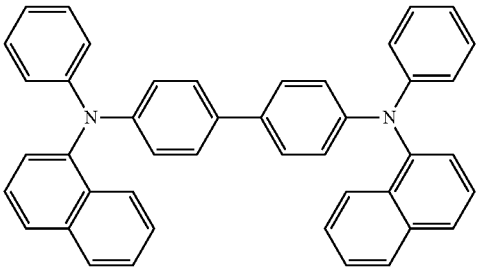

α-NPD

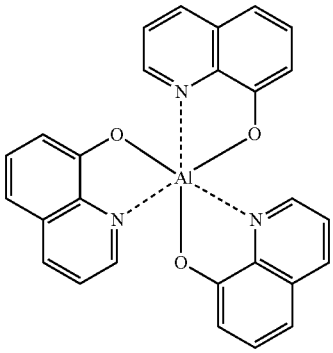

Alq3

(Evaluation of Organic EL Elements 1-1 Through 1-13)

Organic EL Elements prepared as above were evaluated. Table 1 shows the results.

(Taking-Out Quantum Yield)

A constant electric current of 2.5 mA/cm$^2$ was applied to each of the prepared organic EL elements at 23° C. under an ambience of desiccated nitrogen gas and the taking-out quantum yield (in %) was determined. Spectroradiometric luminance meter CS-1000 (produced by Konica Minolta Sensing Inc.) was also employed for the above measurement.

Measured results of the taking-out quantum yield in Table 1 are represented by a relative value, with the measurement value of Organic EL Element 1-1 being 100.

(Lifetime)

When driven at a constant electric current of 2.5 MA/cm$^2$, was the time determined at which luminance immediately after light emission (initial luminance) was lowered by one half. The resulting value was designated as its half life time (τ0.5) and employed as an index of the lifetime. Spectroradiometric luminance meter CS-1000 (produced by Konica Minolta Sensing Inc.) was also employed for this measurement.

Measurement results of the lifetime in Table 1 are shown via relative values when Organic EL Element 1-1 is 100.

TABLE 1

| Organic EL Element | Light Emitting Layer Compound | Taking-Out Quantum Yield | Lifetime | Reference |
|---|---|---|---|---|
| 1-1 | CBP | 100 | 100 | Comparative Example |
| 1-2 | (1) | 134 | 152 | Present Invention |
| 1-3 | (2) | 138 | 131 | Present Invention |
| 1-4 | (4) | 111 | 108 | Present Invention |
| 1-5 | (5) | 123 | 160 | Present Invention |
| 1-6 | (9) | 111 | 118 | Present Invention |
| 1-7 | (10) | 114 | 103 | Present Invention |
| 1-8 | (11) | 128 | 125 | Present Invention |
| 1-9 | (15) | 124 | 113 | Present Invention |
| 1-10 | (21) | 132 | 150 | Present Invention |
| 1-11 | (30) | 135 | 160 | Present Invention |
| 1-12 | (32) | 129 | 133 | Present Invention |
| 1-13 | (36) | 105 | 110 | Present Invention |

As can be seen from Table 1, organic EL elements of the present invention excelled in the taking-out quantum yield and realization of longer lifetime.

Example 2

<Preparation of Organic EL Full-Color Display Device>

FIG. 1 is a schematic constitutional view of an organic EL full-color display device. After applying patterning at a pitch of 100 μm to a substrate (NA45, produced by NH Techno Glass Corp.) which was treated in such a manner that an ITO transparent electrode (102) as an anode was applied onto glass substrate 101 to form a 100 nm film, non-photosensitive partition wall 103 (at a width of 20 μm and a thickness of 2.0 μm) was formed between the ITO transparent electrodes on the above glass substrate via photolithography. The positive hole injecting layer composition of the following formula was injected into the space between the polyimide partition walls on the ITO electrode by employing an ink-jet head (MJ800C, produced by Epson Corp.), followed by a drying process at 200° C. over 10 minutes, whereby positive hole injecting layer 104 was prepared. Onto the resulting positive hole injecting layer discharged was each of the following blue light emitting layer composition, green light emitting layer composition, and red light emitting layer composition, and each of the light emitting layers (105B, 105G, and 105R) was formed. At the end, Al (106) as a cathode was subjected to vacuum deposition so as to cover light emitting layer 105, whereby an organic EL element was prepared.

The prepared organic EL element results in each of the blue, green, or red light emission via applications of electric voltage to each of the electrodes, whereby it was found that it was possible to employ them in a full-color display device.

| (Positive Hole Injecting Layer Composition) | |
|---|---|
| Aqueous PEDOT/PSS mixture dispersion (1.0% by weight) | 20 parts by weight |
| Water | 65 parts by weight |
| Ethoxyethanol | 10 parts by weight |
| Glycerin | 5 parts by weight |
| PEDOT/PSS: poly(3,4-)ethylene-dioxythiophene)-polystyrene sulfonate (produced by Bayer AG) | |

| (Blue Light Emitting Layer Composition) | |
|---|---|
| Ir Compound (1) | 0.7 part by weight |
| Ir-12 | 0.04 part by weight |
| Cyclohexylbenzene | 50 parts by weight |
| Isopropylbiphenyl | 50 parts by weight |

| (Green Light Emitting Layer Composition) | |
|---|---|
| Compound (1) | 0.7 part by weight |
| Ir-1 | 0.04 part by weight |
| Cyclohexylbenzene | 50 parts by weight |
| Isopropylbiphenyl | 50 part by weight |

| (Red Light Emitting Layer Composition) | |
|---|---|
| Compound (1) | 0.7 part by weight |
| Ir-9 | 0.04 part by weight |
| Cyclohexylbenzene | 50 parts by weight |
| Isopropylbiphenyl | 50 part by weight |

Further, it was found that organic EL elements which were prepared employing Compounds (4), (19), (21), (28), (31), (32), and (40) instead of Compound (1) were employable as a full-color display device.

Example 3

(Preparation of Organic EL Element 3-1)

After applying patterning to a substrate (NA45, produced by NH Techno Glass Corp.) which was treated in such a manner that ITO (indium tin oxide), as an anode, was applied onto a 100 mm×100 mm×1.1 mm glass substrate to form a 100 nm film, the transparent substrate provided with the above ITO transparent electrode was subjected to ultrasonic cleaning employing isopropyl alcohol, dried in desiccated nitrogen gas, and subjected to UV ozone cleaning over 5 minutes. The resulting substrate was mounted in a commercial spin coater and subjected to spin coating (at a film thickness of about 40 nm) under the conditions of 1,000 rpm and 30 seconds, employing a solution prepared by dissolving 60 mg of PVK in 10 ml of 1,2-dichloroethane, followed by drying under vacuum at 60° C. for one hour, whereby a positive hole transporting layer was prepared.

Subsequently, spin coating (at a film thickness of about 40 nm) was carried out at the conditions of 1,000 rpm and 30 seconds employing a solution prepared by dissolving 60 mg of Compound (1), 3.0 mg of Ir-9, and 3.0 mg of IOr-12 in 6 ml of toluene, followed by drying under vacuum at 60° C. for one hour, whereby a light emitting layer was prepared.

Further, spin coating (at a film thickness of about 10 nm) was carried out at the conditions of 1,000 rpm and 30 seconds employing a solution prepared by dissolving 20 mg of basocuproin (BCP) in 6 ml of cyclohexane, followed by drying under vacuum at 60° C. for one hour, whereby a positive hole inhibition layer was prepared.

Subsequently, the resulting substrate was fixed onto the substrate holder of a vacuum deposition apparatus. On the other hand, 200 mg of $Alq_3$ was placed in a molybdenum resistance heating boat, and fitted onto the vacuum deposition apparatus. After lowering the pressure of a vacuum tank to $4\times10^{-4}$ Pa, the above heating boat incorporating $Alq_3$ was heated via electric current and vapor deposition was applied onto the above positive hole inhibition layer at a deposition rate of 0.1 nm/second, whereby a 40 nm thick electron transporting layer was provided. The temperature of the substrate during deposition was at room temperature.

Subsequently, 0.5 nm lithium fluoride and 110 nm aluminum were deposited to form a cathode, whereby Organic EL Element 3-1 was prepared.

Electric current was applied to the resulting element, and almost white light was generated, whereby it was found that it was possible to employ it as an illuminating device. It was also found that by replacing Compound (1) with each of Compounds (4), (19), (21), (28), (31), (32), and (40), white light was also emitted.

What is claimed is:

1. An organic electroluminescent element comprising at least an emission layer sandwiched between an anode and a cathode, wherein the emission layer comprises at least a compound represented by Formula (A), Formula (A)

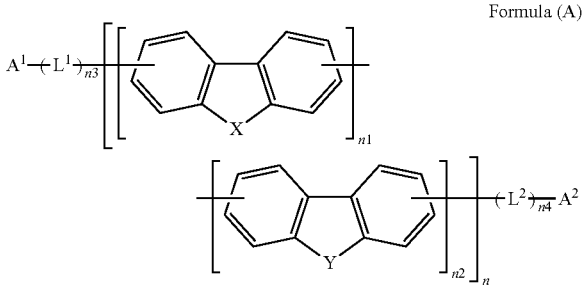

wherein X represents O or S and Y represents O, S or N—R (R represents a hydrogen atom or a substituent); $A^1$ and $A^2$ each represent a hydrogen atom or a substituent and at least one of $A^1$ and $A^2$ is a substituent; $L^1$ and $L^2$ each represent a divalent linking group; n is an integer of 1 [or more] *to 5*; n1 and n2 each are an integer of 1 [or more] *to 2*; n3 and n4 each are 0 or 1; provided that n1+n2≥2, wherein X and Y are different.

2. The organic electroluminescent element of claim 1, wherein the compound represented by Formula (A) is further represented by Formula (2), Formula (2)

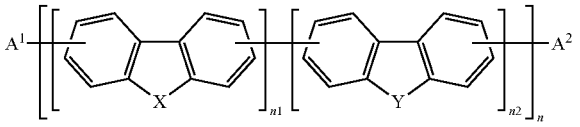

wherein X represents O or S and Y represents O, S or N—R (R represents a hydrogen atom or a substituent); *n is an integer of 1 to 5,* n1[.] *and* n2 [and n represent] *each are* an integer of 1 [or more] *to 2*; $A^1$ and $A^2$ each represent a hydrogen atom or a substituent; and at least one of $A^1$ and $A^2$ is a substituent.

[3. The organic electroluminescent element of claim 2, wherein n is an integer of 1 to 5.]

4. The organic electroluminescent element of [claim 2] *claim 1*, wherein n is an integer of 1 or 2.

5. The organic electroluminescent element of claim 1, wherein at least one of $A^1$ and $A^2$ incorporate a substituent having a nitrogen atom.

6. The organic electro luminescent element of claim 5, wherein the substituent having the nitrogen atom is a carbazolyl group.

7. The organic electroluminescent element of claim 5, wherein the substituent having the nitrogen atom is a carbolinyl group.

8. The organic electro luminescent element of claim 5, wherein the substituent having the nitrogen atom is a diarylamino group.

9. The organic electroluminescent element of claim 1, wherein X is an oxygen atom.

10. The organic electroluminescent element of claim 1, wherein the emission layer incorporates a phosphorescence-emitting metal complex.

11. The organic electroluminescent element of claim 10, wherein the phosphorescence-emitting metal complex is an Ir complex.

12. The organic electroluminescent element of claim 1, generating emission of white color.

13. A display, comprising the organic electroluminescent element described in claim 1.

14. A lighting device comprising the organic electroluminescent element described in claim 1.

* * * * *